United States Patent
Blouin et al.

(10) Patent No.: US 10,164,189 B2
(45) Date of Patent: Dec. 25, 2018

(54) POLYMER COMPRISING A THIADIAZOL GROUP, THE PRODUCTION OF SUCH POLYMER AND ITS USE IN ORGANIC ELECTRONIC DEVICES

(71) Applicant: Merck Patent GmbH, Darmstadt (DE)

(72) Inventors: Nicolas Blouin, Southampton (GB);
Lana Nanson, Southampton (GB);
Stephane Berny, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 218 days.

(21) Appl. No.: 14/652,919

(22) PCT Filed: Nov. 21, 2013

(86) PCT No.: PCT/EP2013/003517
§ 371 (c)(1),
(2) Date: Jun. 17, 2015

(87) PCT Pub. No.: WO2014/094955
PCT Pub. Date: Jun. 26, 2014

(65) Prior Publication Data
US 2015/0340616 A1  Nov. 26, 2015

(30) Foreign Application Priority Data
Dec. 18, 2012 (EP) .................... 12008417

(51) Int. Cl.
*H01L 51/00* (2006.01)
*C08G 75/32* (2006.01)
*C08G 81/00* (2006.01)
*C08K 3/04* (2006.01)
*C08G 61/12* (2006.01)
*C09D 165/00* (2006.01)
*H01L 51/50* (2006.01)
*C08L 65/00* (2006.01)
*H01L 51/42* (2006.01)

(52) U.S. Cl.
CPC ........ *H01L 51/0036* (2013.01); *C08G 61/123* (2013.01); *C08G 75/32* (2013.01); *C08G 81/00* (2013.01); *C08K 3/04* (2013.01); *C09D 165/00* (2013.01); *H01L 51/0035* (2013.01); *H01L 51/0043* (2013.01); *C08G 2261/3223* (2013.01); *C08G 2261/3243* (2013.01); *C08G 2261/3246* (2013.01); *C08G 2261/411* (2013.01); *C08G 2261/414* (2013.01); *C08G 2261/91* (2013.01); *C08G 2261/92* (2013.01); *C08G 2261/95* (2013.01); *C08L 65/00* (2013.01); *H01L 51/4253* (2013.01); *H01L 51/5012* (2013.01); *H01L 51/5056* (2013.01); *H01L 51/5072* (2013.01); *H01L 51/5088* (2013.01); *H01L 51/5092* (2013.01); *Y02E 10/549* (2013.01)

(58) Field of Classification Search
CPC ............ H01L 51/0034; H01L 51/0043; H01L 51/0036; C08G 75/06; C08G 75/32
See application file for complete search history.

(56) References Cited

U.S. PATENT DOCUMENTS

| 2011/0156018 | A1 | 6/2011 | Moriwaki et al. |
| 2013/0092912 | A1 | 4/2013 | You |
| 2013/0200354 | A1* | 8/2013 | Zhu .................... H01L 51/0043 257/40 |

FOREIGN PATENT DOCUMENTS

| EP | 2327734 A1 | 6/2011 |
| JP | 2013-95813 A | 5/2013 |
| WO | 2011/156478 A2 | 12/2011 |
| WO | WO 2012054910 A1 * | 4/2012 ......... H01L 51/0043 |

OTHER PUBLICATIONS

International Search Report dated Jan. 30, 2014 issued in corresponding PCT/EP2013/003517 application (pp. 1-4).
English Translation Abstract of JP 2013-095813 published May 20, 2013.
European Examination Report dated Oct. 27, 2017 issued in corresponding EP 13794820.4 application (4 pages).
MD Lechner et al., "Macromolecular Chemistry—A Textbook for Chemists, Physicists, Material Scientist and Process Engineers", Macromolecular Chemistry (Jan. 1, 1996) XP-002563735 pp. 295-299.
U. Wenzel, "Charakterisierung Eines Ultrahochmolekularen Polymethacrylats Mit Flussigkristalliner Seitengruppe In Verdunnter Losung", Dissertation, vol. D83 (Jul. 5, 2000) XP-007912815 pp. 1-73.

* cited by examiner

*Primary Examiner* — Haidung D Nguyen
(74) *Attorney, Agent, or Firm* — Millen White Zelano and Branigan, PC; Csaba Henter

(57) ABSTRACT

The present invention relates to a novel polymer comprising a thiadiazol group, the production of such a polymer, its use in organic electronic devices as well as such organic electronic devices.

11 Claims, No Drawings

POLYMER COMPRISING A THIADIAZOL GROUP, THE PRODUCTION OF SUCH POLYMER AND ITS USE IN ORGANIC ELECTRONIC DEVICES

TECHNICAL FIELD

The present invention relates to a novel polymer comprising a thiadiazol group, the production of such a polymer, its use in organic electronic devices as well as such organic electronic devices.

BACKGROUND AND DESCRIPTION OF THE PRIOR ART

Organic electronic materials, such as for example semiconducting organic materials, and their application in electronic devices have generated a lot of interest in research, in particular because they are seen as alternatives to the conventional amorphous silicon technology. Advantages of organic semiconducting materials include the possibility of low-cost production as well as high throughput in combination with low temperature deposition, solution processability and ease of fabrication of large electronic devices, such as for example large television screens. Furthermore, the resulting electronic devices are characterized by flexibility and reduced weight, thus making them more suited for transportable devices.

A particular field of interest is organic photovoltaics (OPV). Polymers have found use in photovoltaics because the respective devices can be manufactured by solution-processing techniques such as spin casting, dip coating or ink jet printing. Compared to the evaporation methods used in the manufacture of conventional inorganic photovoltaic devices, solution processes are cheaper and also allow production on a larger scale.

While a large number of organic compounds have been synthesized and evaluated for potential use as organic electronic materials, progress in the field has been hampered by the fact that the properties of the resulting materials are difficult, if not impossible, to predict. Research and industry therefore have continuing interest in increasing the pool of organic semiconducting materials. Additional advantages of the present invention will become evident from the following description and examples.

SUMMARY OF THE INVENTION

It has been surprisingly found that the presently disclosed polymer comprising a thiadiazol group shows good properties for use as organic electronic material.

Thus, the present application provides for a polymer comprising at least one divalent unit U of formula (I)

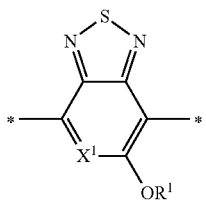

(I)

wherein $X^1$ is N or C—F; and $R^1$ is hydrogen or a carbyl group having from 1 to 40 carbon atoms.

The present application also provides for a process for producing said polymer, said process comprising the step of coupling monomers, therein comprised a monomer comprising the divalent unit of formula I, said monomers comprising at least one functional monovalent group selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$, wherein $X^0$ is halogen, and $Z^0$, $Z^1$, $Z^2$, $Z^3$ and $Z^4$ are independently of each other selected from the group consisting of alkyl and aryl, each being optionally substituted, and two groups $Z^2$ may also together form a cyclic group.

The invention further relates to a formulation comprising one or more polymers comprising a unit of formula I and one or more solvents, preferably selected from organic solvents.

The invention further relates to the use of units of formula I as electron acceptor units in semiconducting polymers.

The invention further relates to conjugated polymers comprising one or more repeating units of formula I and/or one or more groups selected from aryl and heteroaryl groups that are optionally substituted, and wherein at least one repeating unit in the polymer is a unit of formula I.

The invention further relates to monomers containing a unit of formula I and further containing one or more reactive groups which can be reacted to form a conjugated polymer as described above and below.

The invention further relates to semiconducting polymers comprising one or more units of formula I as electron acceptor units, and preferably further comprising one or more units having electron donor properties.

The invention further relates to the use of the polymers according to the present invention as electron acceptor or n-type semiconductor.

The invention further relates to the use of the polymers according to the present invention as electron acceptor component in a semiconducting material, formulation, polymer blend, device or component of a device.

The invention further relates to a semiconducting material, formulation, polymer blend, device or component of a device comprising a polymer according to the present invention as electron acceptor component, and preferably further comprising one or more compounds or polymers having electron donor properties.

The invention further relates to a mixture or polymer blend comprising one or more polymers according to the present invention and one or more additional compounds which are preferably selected from compounds having one or more of semiconducting, charge transport, hole or electron transport, hole or electron blocking, electrically conducting, photoconducting or light emitting properties.

The invention further relates to a mixture or polymer blend as described above and below, which comprises one or more polymers of the present invention and one or more p-type organic semiconductor compounds, preferably selected from fullerenes or substituted fullerenes.

The invention further relates to a formulation comprising one or more polymers, formulations, mixtures or polymer blends according to the present invention and optionally one or more solvents, preferably selected from organic solvents.

The invention further relates to the use of a polymer, formulation, mixture or polymer blend of the present invention as charge transport, semiconducting, electrically conducting, photoconducting or light emitting material, or in an optical, electrooptical, electronic, electroluminescent or photoluminescent device, or in a component of such a device or in an assembly comprising such a device or component.

The invention further relates to a charge transport, semiconducting, electrically conducting, photoconducting or light emitting material comprising a polymer, formulation, mixture or polymer blend according to the present invention.

The invention further relates to an optical, electrooptical, electronic, electroluminescent or photoluminescent device, or a component thereof, or an assembly comprising it, which comprises a polymer, formulation, mixture or polymer blend, or comprises a charge transport, semiconducting, electrically conducting, photoconducting or light emitting material, according to the present invention.

The optical, electrooptical, electronic, electroluminescent and photoluminescent devices include, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors.

The components of the above devices include, without limitation, charge injection layers, charge transport layers, interlayers, planarizing layers, antistatic films, polymer electrolyte membranes (PEM), conducting substrates and conducting patterns.

The assemblies comprising such devices or components include, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

In addition the compounds, polymers, formulations, mixtures or polymer blends of the present invention can be used as electrode materials in batteries and in components or devices for detecting and discriminating DNA sequences.

DETAILED DESCRIPTION OF THE INVENTION

Definitions

For the purpose of the present application an asterisk ("*") denotes a linkage to a an adjacent unit or group, and in case of a polymer it may denote a link to an adjacent repeating unit or to a terminal group of the polymer chain. The asterisk is further used to denote the ring atoms at which aromatic or heteroaromatic rings are fused to other aromatic or heteroaromatic rings.

The polymers of the present invention are easy to synthesize and exhibit advantageous properties. They show good processability for the device manufacture process, high solubility in organic solvents, and are especially suitable for large scale production using solution processing methods. At the same time, the co-polymers derived from monomers of the present invention and electron donor monomers show low bandgaps, high charge carrier mobilities, high external quantum efficiencies in BHJ (bulk heterojunction) solar cells, good morphology when used in p/n-type blends, e.g. with fullerenes, high oxidative stability, and a long lifetime in electronic devices, and are promising materials for organic electronic OE devices, especially for OFETs with high charge carrier mobility and good on/off ratio, and for OPV devices with high power conversion efficiency.

The units of formula I are especially suitable as (electron) acceptor unit in both n-type and p-type semiconducting compounds, polymers or copolymers, in particular copolymers containing both donor and acceptor units, and for the preparation of blends of p-type and n-type semiconductors which are suitable for use in BHJ OPV devices.

The synthesis of the unit of formula I, its functional derivatives, compounds, homopolymers, and co-polymers can be achieved based on methods that are known to the skilled person and are described in the literature, as will be further illustrated herein.

As used herein, the term "polymer" will be understood to mean a molecule of high relative molecular mass, the structure of which essentially comprises the multiple repetition of units derived, actually or conceptually, from molecules of low relative molecular mass (Pure Appl. Chem., 1996, 68, 2291). The term "oligomer" will be understood to mean a molecule of intermediate relative molecular mass, the structure of which essentially comprises a small plurality of units derived, actually or conceptually, from molecules of lower relative molecular mass (Pure Appl. Chem., 1996, 68, 2291). In a preferred meaning as used herein a polymer will be understood to mean a compound having >1, i.e. at least 2 repeat units, preferably ≥5 repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (Pure Appl. Chem., 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerisation reaction, like for example a group having the meaning of $R^5$ or $R^6$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerisation reaction. Alternatively the endcapper can be added in situ to the reaction mixture before or during the polymerisation reaction. In situ addition of an endcapper can also be used to terminate the polymerisation reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. Aug. 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, Concise Dictionary of Physics, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also Pure Appl. Chem., 1994, 66, 1134).

As used herein, the term "conjugated" will be understood to mean a compound (for example a polymer) that contains mainly C atoms with $sp^2$-hybridisation (or optionally also sp-hybridization), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound. See also International Union of Pure and Applied Chemistry, Compendium of Chemical Technology, Gold Book, Version 2.3.2, 19. Aug. 2012, pages 322-323.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, 1,2,4-trichlorobenzene is used as solvent. The polydispersity index (PDI) is defined as the ratio $M_w/M_n$. The degree of polymerization, also referred to as total number of repeat units, n, will be understood to mean the number average degree of polymerization given as $n=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean any monovalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.).

The term "hydrocarbyl group" will be understood to mean a carbyl group that does additionally contain one or more H atoms and optionally contains one or more hetero atoms like for example N, O, S, P, Si, Se, As, Te or Ge.

As used herein, the term "hetero atom" will be understood to mean an atom in an organic compound that is not a H- or C-atom, and preferably will be understood to mean N, O, S, P, Si, Se, As, Te or Ge.

A carbyl or hydrocarbyl group comprising a chain of 3 or more C atoms may be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 carbon atoms, furthermore optionally substituted aryl or aryloxy having 6 to 40, preferably 6 to 25 carbon atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 carbon atoms, wherein all these groups optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

The terms "aryl" and "heteroaryl" as used herein preferably mean a mono-, bi- or tricyclic aromatic or heteroaromatic group with 4 to 30 ring C atoms that may also comprise condensed rings and is optionally substituted with one or more groups L, wherein L is selected from halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, and is preferably alkyl, alkoxy, thiaalkyl, alkylcarbonyl, alkoxycarbonyl or alkylcarbonyloxy with 1 to 20 C atoms that is optionally fluorinated, and R$^0$, R$^{00}$, X$^0$, P and Sp have the meanings given above and below.

Very preferred substituents L are selected from halogen, most preferably F, or alkyl, alkoxy, oxaalkyl, thioalkyl, fluoroalkyl and fluoroalkoxy with 1 to 12 C atoms or alkenyl, alkynyl with 2 to 12 C atoms.

Especially preferred aryl and heteroaryl groups are phenyl, pyridine, pyrimidine, pyridazine, pyrazine, triazole, tetrazole, pyrazole, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b]dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, all of which can be unsubstituted, mono- or polysubstituted with L as defined above. Further examples of aryl and heteroaryl groups are those selected from the groups shown hereinafter.

An alkyl or alkoxy radical, i.e. where the terminal CH$_2$ group is replaced by —O—, can be straight-chain or branched. It is preferably straight-chain, has 2, 3, 4, 5, 6, 7 or 8 carbon atoms and accordingly is preferably ethyl, propyl, butyl, pentyl, hexyl, heptyl, octyl, ethoxy, propoxy, butoxy, pentoxy, hexoxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

An alkenyl group, wherein one or more CH$_2$ groups are replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are C$_2$-C$_7$-1E-alkenyl, C$_4$-C$_7$-3E-alkenyl, C$_5$-C$_7$-4-alkenyl, C$_6$-C$_7$-5-alkenyl and C$_7$-6-alkenyl, in particular C$_2$-C$_7$-1E-alkenyl, C$_4$-C$_7$-3E-alkenyl and C$_5$-C$_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one CH$_2$ group is replaced by —O— and one by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)-butyl.

An alkyl group wherein two or more CH$_2$ groups are replaced by —O— and/or —C(O)O— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one CH$_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridised vinyl carbon atom is replaced.

A fluoroalkyl group is preferably perfluoroalkyl C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$, or partially fluorinated alkyl, in particular 1,1-difluoroalkyl, or fluorinated in the terminal position(s), all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethylhexoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methyl heptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert-butyl, isopropoxy, 2-methyl-propoxy and 3-methylbutoxy.

In a preferred embodiment, the hydrocarbyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

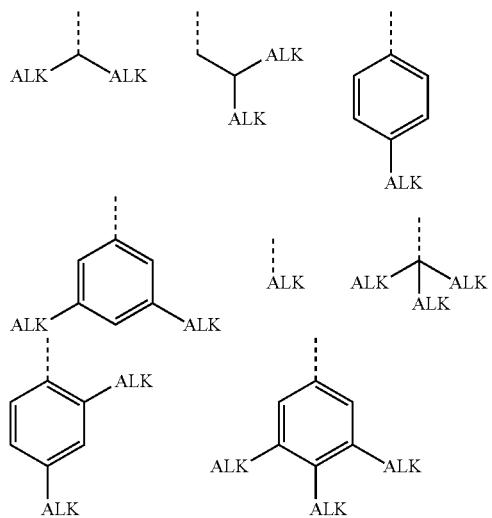

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^1$— is preferably —CH=CH—, —CF=CF— or —CH=C(CN)—.

As used herein, "halogen" includes F, Cl, Br or I, preferably F, Cl or Br.

As used herein, —CO—, —C(=O)— and —C(O)— will be understood to mean a carbonyl group, i.e. a group having the structure

Polymer

The polymer of the present invention comprises at least one divalent unit U of formula (I)

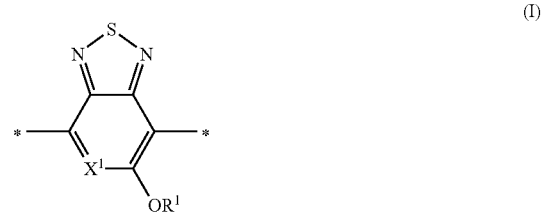

wherein $X^1$ is N or C—F; and $R^1$ is hydrogen or a carbyl group having from 1 to 40 carbon atoms.

Preferably $X^1$ is C—F.

Preferably $R^1$ is hydrogen or an alkyl having from 1 to 20 carbon atoms. More preferably, $R^1$ is an alkyl having from 10 to 20 carbon atoms.

Related polymers are for example known from WO2011018144; WO2011131280; WO2012143077; US20120168727(A1); WO2012030942; US2011290324 (A1); US2010032018(A1); WO2011052702; WO2011052709 (A1); WO2011052725 and WO2010026972(A1).

Preferably the polymer of the present invention comprises at least one repeating unit of formula (II)

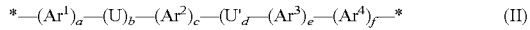

$$*—(Ar^1)_a—(U)_b—(Ar^2)_c—(U')_d—(Ar^3)_e—(Ar^4)_f—* \quad (II)$$

wherein U and U' are independently of each other a divalent unit of formula (I) as defined above; $Ar^1$, $Ar^2$, $Ar^3$ and $Ar^4$ are different from U and U' and are independently of each other selected from the group consisting of substituted aryl, unsubstituted aryl, substituted heteroaryl and unsubstituted heteroaryl; and a, b, c, d, e and f are independently of each other chosen from the group consisting of 0, 1, 2 and 3, with the proviso that b+d 1.

Preferably $Ar^1$, $Ar^2$, $Ar^3$ and $Ar^4$ have from 5 to 30 ring atoms. Optionally $Ar^1$, $Ar^2$, $Ar^3$ and $Ar^4$ are substituted, preferably by one or more groups $R^S$ as defined below.

Preferably $R^S$ is, on each occurrence identically or differently, selected from the group consisting of F, Br, Cl, —CN, —NC, —NCO, —NCS, —OCN, —SCN, —C(O)$NR^0R^{00}$, —C(O)$X^0$, —C(O)$R^0$, —C(O)$OR^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl and hydrocarbyl with 1 to 40 C atoms that is optionally substituted and optionally comprises one or more hetero atoms.

$R^S$ more preferably denotes, on each occurrence identically or differently, H, straight-chain, branched or cyclic alkyl with 1 to 30 C atoms, in which one or more $CH_2$ groups are optionally replaced by —O—, —S—, —C(O)—, —C(S)—, —C(O)—O—, —O—C(O)—, —$NR^0$—, —$SiR^0R^{00}$—, —$CF_2$—, —$CR^0$=$CR^{00}$—, —$CY^1$=$CY^2$— or —C≡C— in such a manner that O and/or S atoms are not linked directly to one another, and in which one or more H atoms are optionally replaced by F, Cl, Br, I or CN, or denotes aryl, heteroaryl, aryloxy or heteroaryloxy with 4 to 20 ring atoms which is optionally substituted, preferably by halogen or by one or more of the aforementioned alkyl or cyclic alkyl groups.

Preferably $R^0$ and $R^{00}$ are independently of each other H or optionally substituted $C_{1-40}$ carbyl or hydrocarbyl, and more preferably denote H or alkyl with 1 to 12 C-atoms.

Preferably $X^0$ is halogen. More preferably $X^0$ is F, Cl or Br.

More preferably $Ar^2$ is an unsubstituted heteroaryl or a heteroaryl substituted with one or more groups $R^S$, with $R^S$ as defined above. Even more preferably $Ar^2$ is an unsubstituted heteroaryl or a heteroaryl substituted with one or more groups $R^S$, with $R^S$ as defined above, wherein $Ar^2$ has electron donor properties. Even more preferably, $Ar^2$ is selected from formulae (D1) to (D116) as defined below. Most preferably, $Ar^2$ is selected from the group consisting of D1, D5, D6, D7, D8, D20, D25, D30, D31, D32, D39, D47, D48, D50, D51, D70, D71, D72, D77, D83, D84, D85, D88 and D89.

More preferably $Ar^3$ is an aromatic ring of formula (II-A)

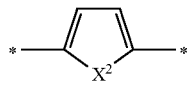
(II-A)

wherein $X^2$ is selected from the group consisting of oxygen, nitrogen, sulfur and selenium. Even more preferably $Ar^3$ is an aromatic ring of formula (I-A) wherein $X^2$ is sulfur or selenium. Most preferably $Ar^3$ is an aromatic ring of formula (I-A) wherein $X^2$ is sulfur.

Also preferred are block copolymers comprising at least one divalent unit of formula (IIIa) or (IIIb)

(IIIa)

(IIIb)

wherein U, $Ar^1$ and $Ar^2$ are as defined above, and g and h are integers and are at least 2.

Further preferred polymers according to the present invention comprise, in addition to the units of formula I, or II, one or more repeating units selected from monocyclic or polycyclic aryl or heteroaryl groups that are optionally substituted.

These additional repeating units are preferably selected of formula (IIIc) and (IIId)

(IIIc)

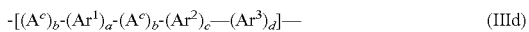
(IIId)

wherein $Ar^1$, $Ar^2$, $Ar^3$, a, b, c and d are as defined in formula II, and $A^c$ is an aryl or heteroaryl group that is different from U and $Ar^{1-3}$, preferably has 5 to 30 ring atoms, is optionally substituted by one or more groups $R^S$ as defined above and below, and is preferably selected from aryl or heteroaryl groups having electron acceptor properties, wherein the polymer comprises at least one repeating unit of formula IIIa or IIIb wherein b is at least 1.

The conjugated polymers according to the present invention are preferably selected of formula IV:

IV wherein
A, B, C independently of each other denote a distinct unit of formula I, II, IIIa, IIIb, or their subformulae,
x is >0 and ≤1,
y is ≥0 and <1,
z is ≥0 and <1,
x+y+z is 1, and
n is an integer >1.

Preferred polymers of formula IV are selected of the following formulae

IVa

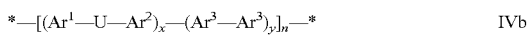
IVb

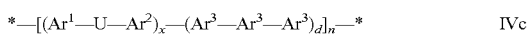
IVc

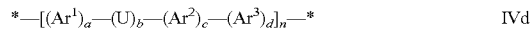
IVd

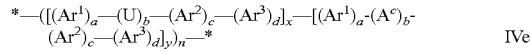
IVe

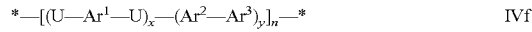
IVf

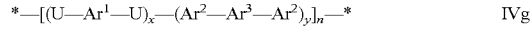
IVg

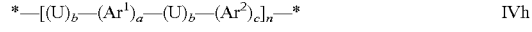
IVh

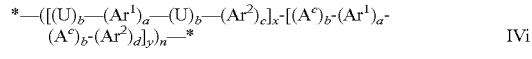
IVi

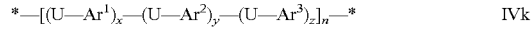
IVk wherein U, $Ar^1$, $Ar^2$, $Ar^3$, a, b, c and d have in each occurrence identically or differently one of the meanings given for formula II, $A^c$ has on each occurrence identically or differently one of the meanings given for formulae IIIa and IIIb, and x, y, z and n are as defined for formula IV, wherein these polymers can be alternating or random copolymers, and wherein in formula IVd and IVe in at least one of the repeating units $[(Ar^1)_a—(U)_b—(Ar^2)_c—(Ar^3)_d]$ and in at least one of the repeating units $[(Ar^1)_a\text{-}(A^c)_b\text{-}(Ar^2)_c—(Ar^3)_d]$ b is at least 1 and wherein in formula IVh and IVi in at least one of the repeating units $[(U)_b—(Ar^1)_a—(U)_b—(Ar^2)_d]$ and in at least one of the repeating units $[(U)_b—(Ar^1)_a—(U)_b—(Ar^2)_d]$ b is at least 1.

In the polymer of the present invention, the total number n of repeating units is preferably from 2 to 10,000. The total number n of repeating units is preferably 5, very preferably ≥10, most preferably ≥50, and preferably ≤500, very preferably ≤1,000, most preferably ≤2,000, including any combination of the aforementioned lower and upper limits of n.

The polymers of the present invention include homopolymers and copolymers, like statistical or random copolymers, alternating copolymers and block copolymers, as well as combinations thereof.

Especially preferred are polymers selected from the following groups:
a) Group 1 consisting of homopolymers of the unit U or $(Ar^1—U)$ or $(Ar^1—U—Ar^2)$ or $(Ar^1—U—Ar^3)$ or $(U—Ar^2—Ar^3)$ or $(Ar^1—U—Ar^2—Ar^3)$ or $(U—Ar^1—U)$, i.e. where all repeating units are identical,
b) Group 2 consisting of random or alternating copolymers formed by identical units $(Ar^1—U—Ar^2)$ or $(U—Ar^1—U)$ and identical units $(Ar^3)$,
c) Group 3 consisting of random or alternating copolymers formed by identical units $(Ar^1—U—Ar^2)$ or $(U—Ar^1—U)$ and identical units $(A^1)$,
d) Group 4 consisting of random or alternating copolymers formed by identical units $(Ar^1—U—Ar^2)$ or $(U—Ar^1—U)$ and identical units $(Ar^1\text{-}A^c\text{-}Ar^2)$ or $(A^1\text{-}Ar^1\text{-}A^1)$,
wherein in all these groups U, $A^c$, $Ar^1$, $Ar^2$ and $Ar^3$ are as defined above and below, in groups 1, 2 and 3 $Ar^1$, $Ar^2$ and $Ar^3$ are different from a single bond, and in group 4 one of $Ar^1$ and $Ar^2$ may also denote a single bond.

Preferred polymers of formula IV and IVa to IVk may be selected of formula V

V wherein "chain" denotes a polymer chain of formulae IV or IVa to IVk, and $R^5$ and $R^6$ have independently of each other one of the meanings of $R^S$ as defined above, or denote, independently of each other, H, F, Br, Cl, I, —CH$_2$Cl, —CHO, —CR'=CR"$_2$, —SiR'R"R'", —SiR'X'X", —SiR'R"X', —SnR'R"R'", —BR'R", —B(OR')(OR"), —B(OH)$_2$, —O—SO$_2$—R', —C≡CH, —C≡C—SiR'$_3$, —ZnX' or an endcap group, X' and X" denote halogen, R', R" and R'" have independently of each other one of the meanings of $R^0$ given in formula I, and two of R', R" and R'" may also form a ring together with the hetero atom to which they are attached.

Preferred endcap groups $R^5$ and $R^6$ are H, $C_{1-20}$ alkyl, or optionally substituted $C_{6-12}$ aryl or $C_{2-10}$ heteroaryl, very preferably H or phenyl.

In the polymers represented by formula IV, IVa to IVk and V, x, y and z denote the mole fraction of units A, B and C, respectively, and n denotes the degree of polymerisation or total number of units A, B and C. These formulae includes block copolymers, random or statistical copolymers and alternating copoymers of A, B and C, as well as homopolymers of A for the case when x>0 and y=z=0.

Monomer

The invention further relates to monomers of formula VIa and VIb

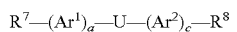   VIa

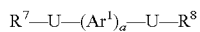   VIb wherein U, $Ar^1$, $Ar^2$, a and c have the meanings of formula IIa, or one of the preferred meanings as described above and below, and $R^7$ and $R^8$ are, preferably independently of each other, selected from the group consisting of Cl, Br, I, O-tosylate, O-triflate, O-mesylate, O-nonaflate, —$SiMe_2F$, —$SiMeF_2$, —O—$SO_2Z^1$, —$B(OZ^2)_2$, —$CZ^3$=$C(Z^3)_2$, —C≡$CSi(Z^1)_3$, —$ZnX^0$ and —$Sn(Z^4)_3$, wherein $X^0$ is halogen, preferably Cl, Br or I, and $Z^{1-4}$ are selected from the group consisting of alkyl and aryl, each being optionally substituted, and two groups $Z^2$ may also together form a cyclic group.

Especially preferred are monomers of the following formulae

   VI1

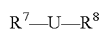   VI2

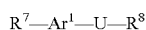   VI3

   VI4

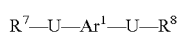   VI5 wherein U, $Ar^1$, $Ar^2$, $R^7$ and $R^8$ are as defined in formula VI.

Especially preferred are repeating units, monomers and polymers of formulae I, IIa, IIb, IIIa. IIIb, IV, IVa-IVk, V, VIa, VIb and their subformulae wherein one or more of $Ar^1$, $Ar^2$ and $Ar^3$ denote aryl or heteroaryl, preferably having electron donor properties, selected from the group consisting of the following formulae or their respective mirror image

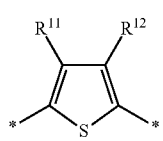   (D1)

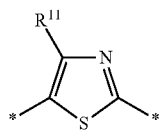   (D2)

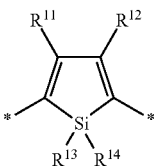   (D3)

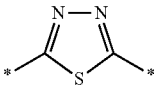   (D4)

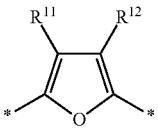   (D5)

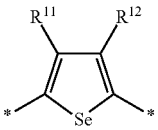   (D6)

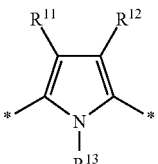   (D7)

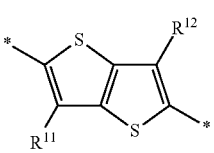   (D8)

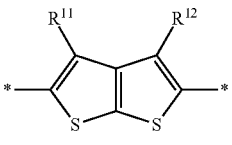   (D9)

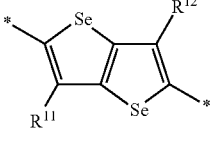   (D10)

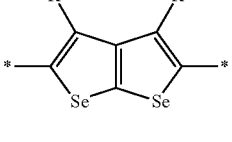   (D11)

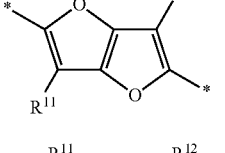   (D12)

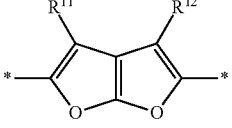   (D13)

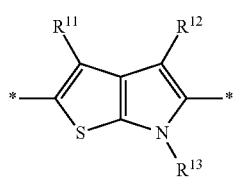 (D14)
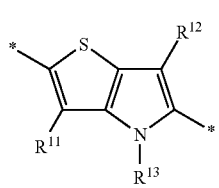 (D15)
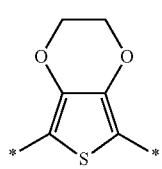 (D16)
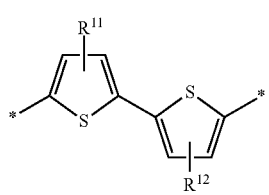 (D17)
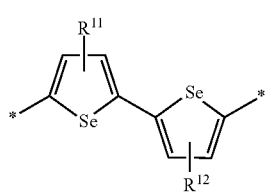 (D18)
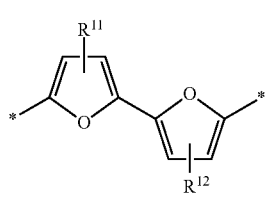 (D19)
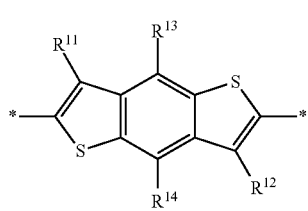 (D20)
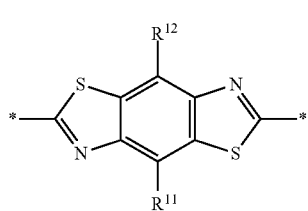 (D21)
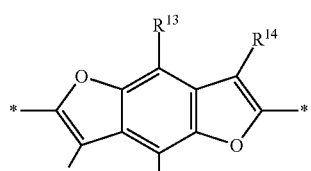 (D22)
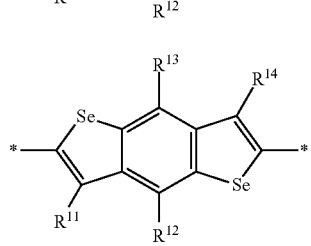 (D23)
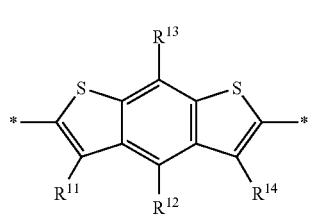 (D24)
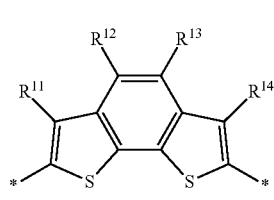 (D25)
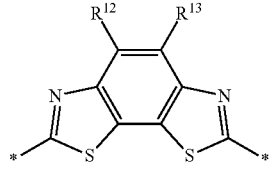 (D26)
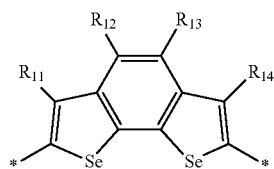 (D27)
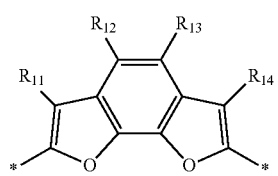 (D28)
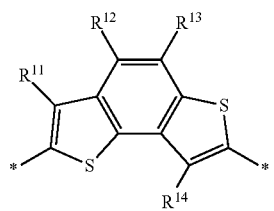 (D29)

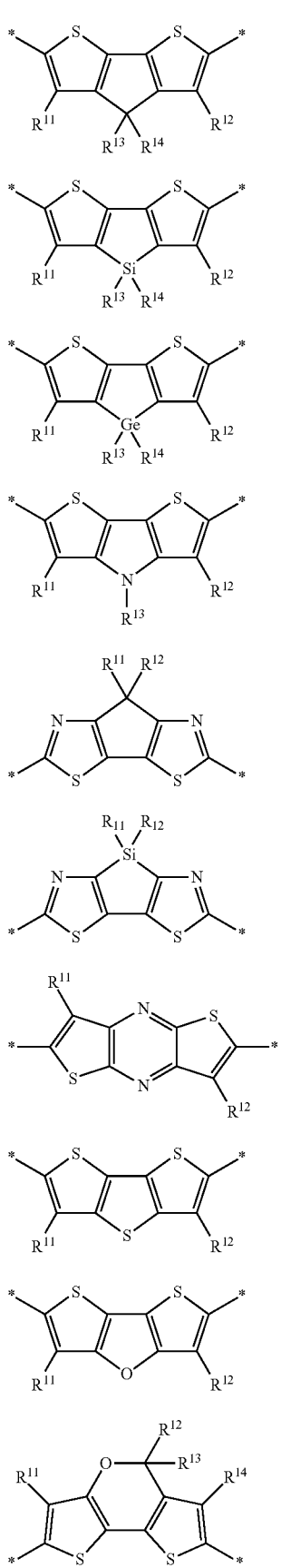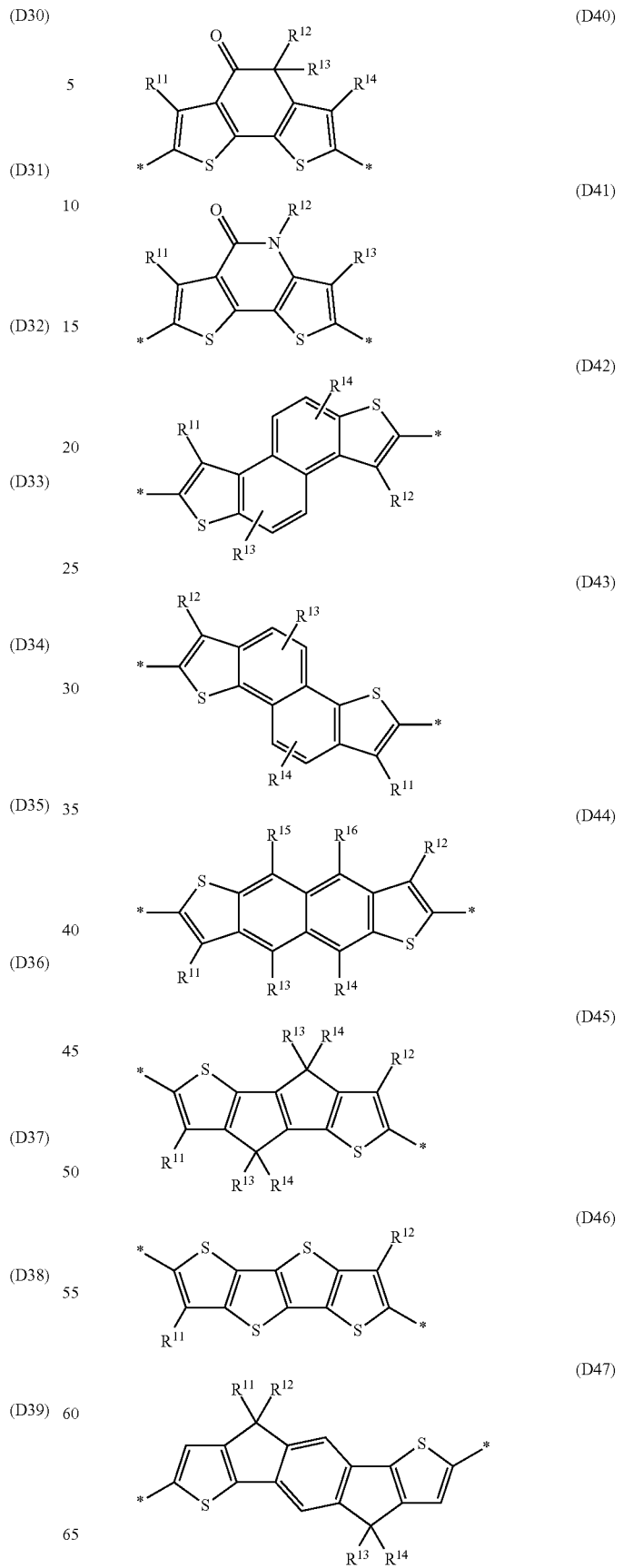

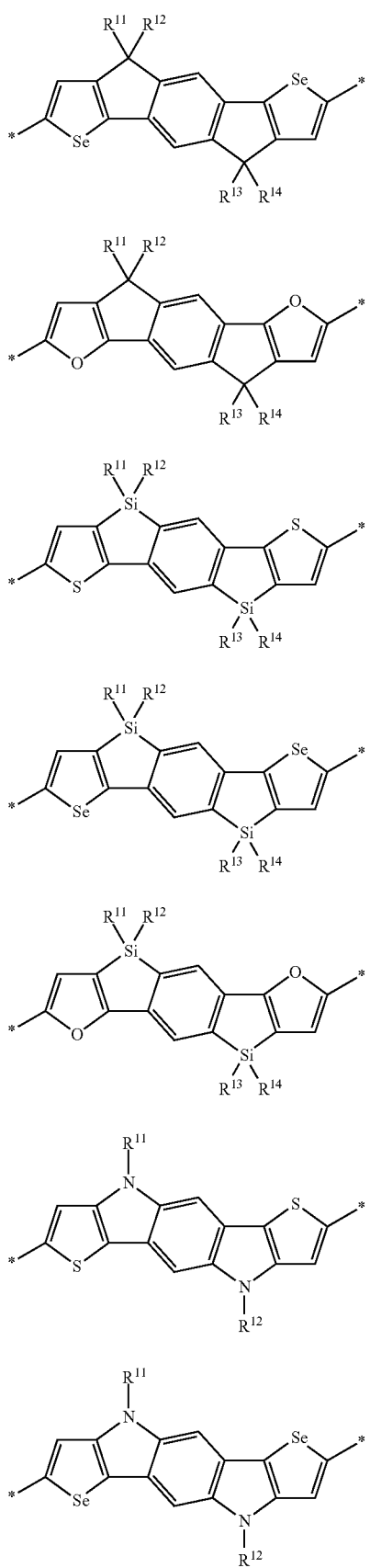
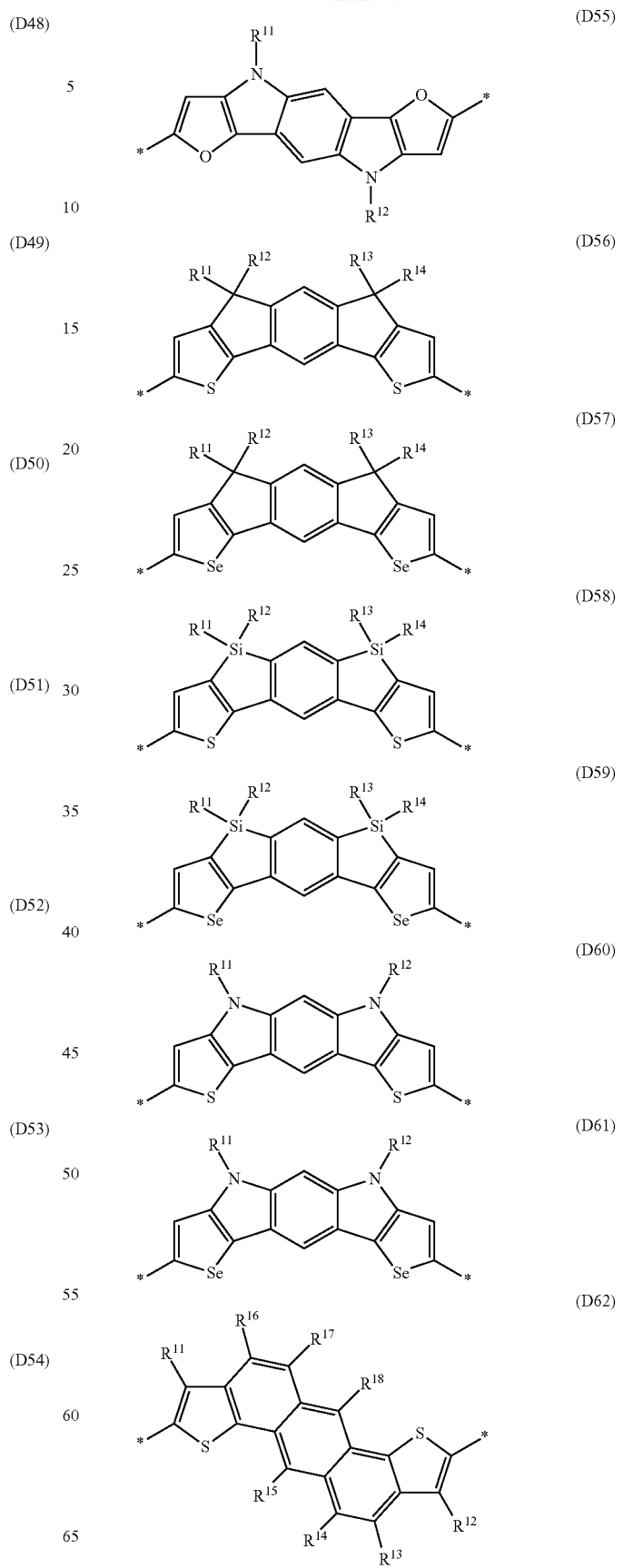

-continued
(D63)
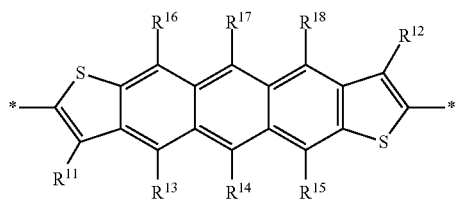
(D64)
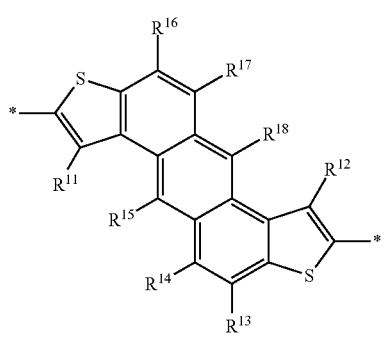
(D65)
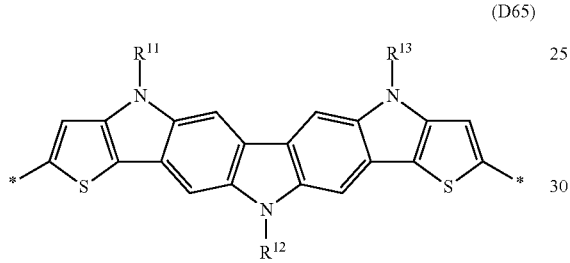
(D66)
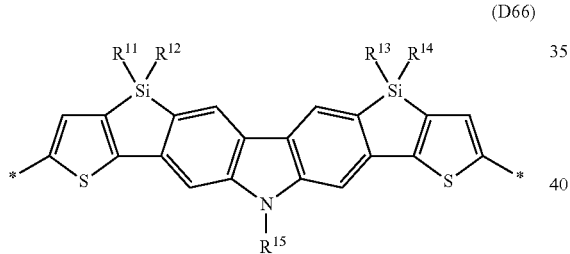
(D67)
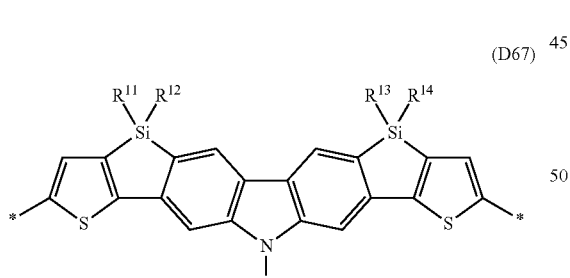
(D68)
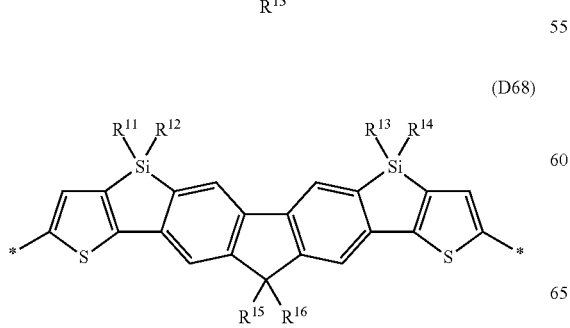
-continued
(D69)
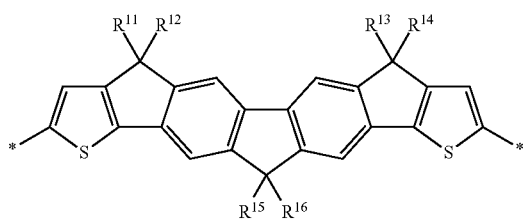
(D70)
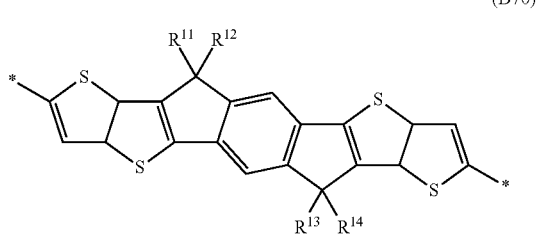
(D71)
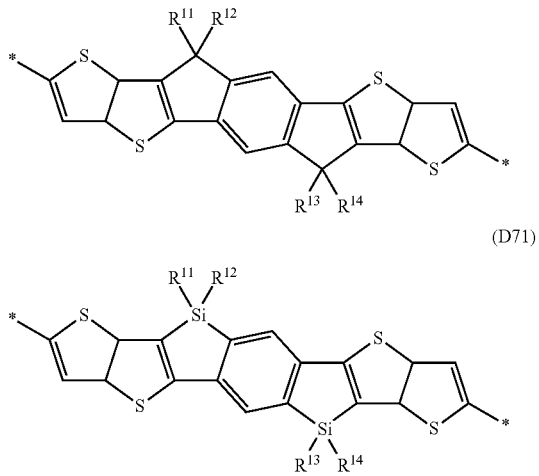
(D72)
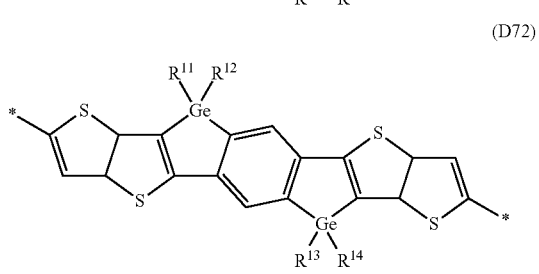
(D73)
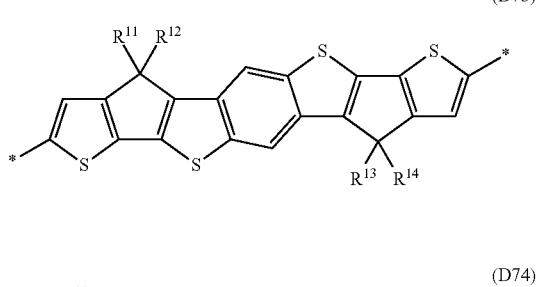
(D74)
(D75)

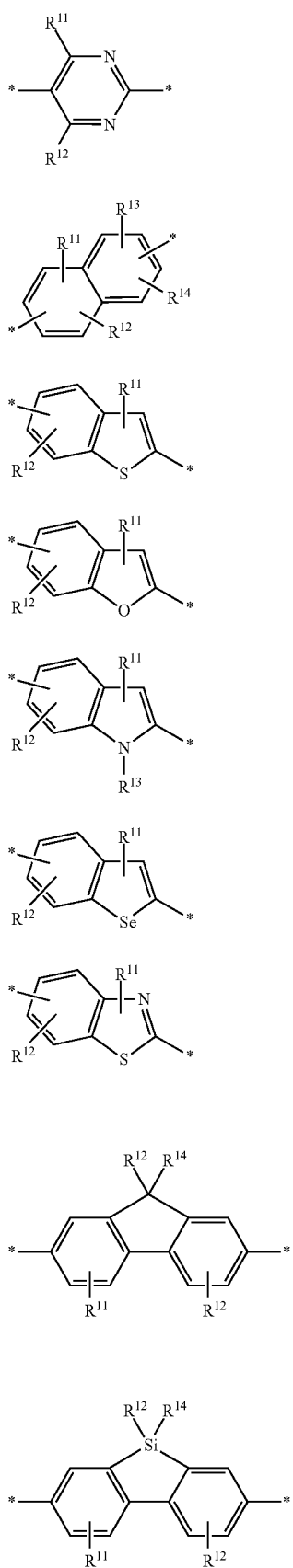
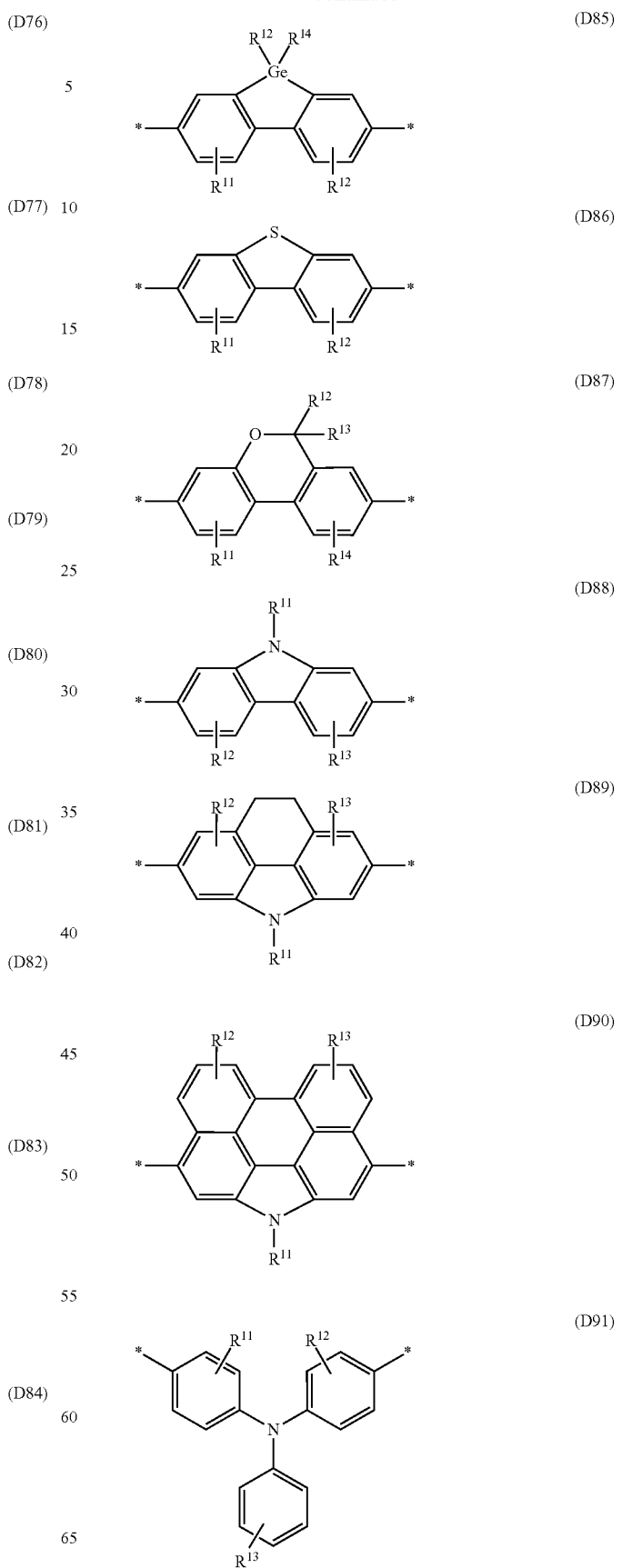

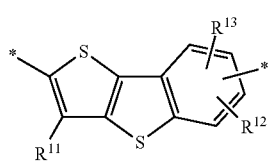 (D92)
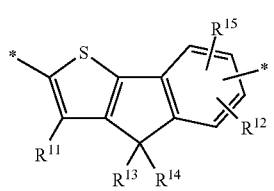 (D93)
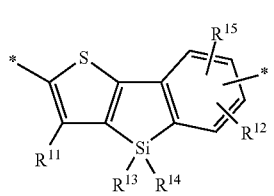 (D94)
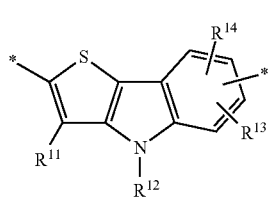 (D95)
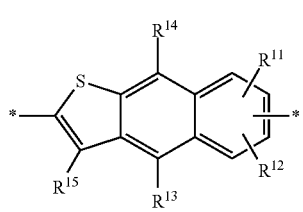 (D96)
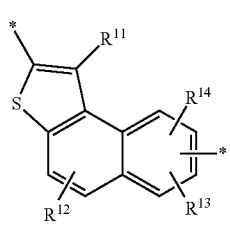 (D97)
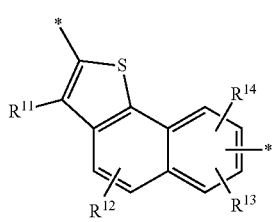 (D98)
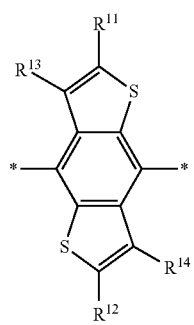 (D99)
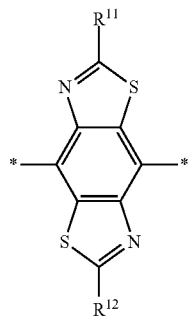 (D100)
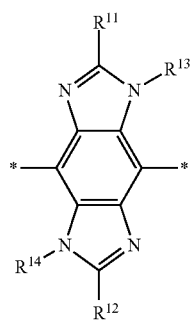 (D101)
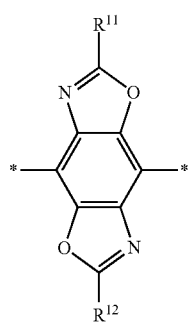 (D102)
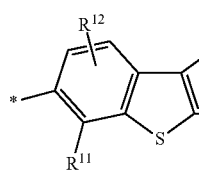 (D103)

(D104) 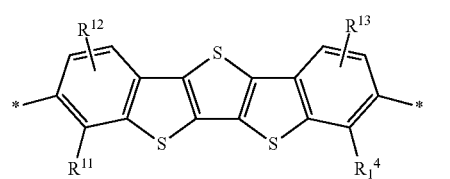
(D105) 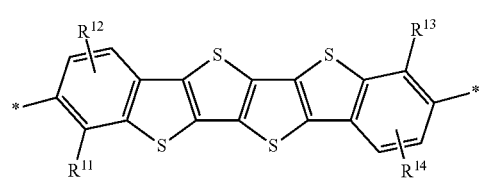
(D106) 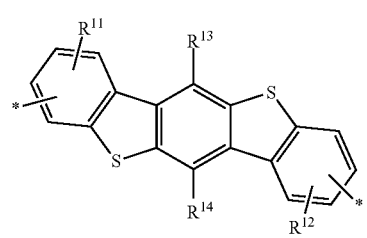
(D107) 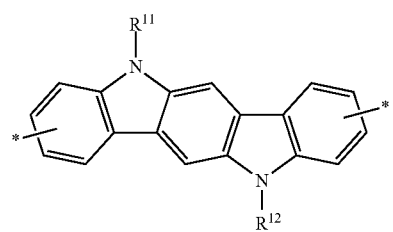
(D108) 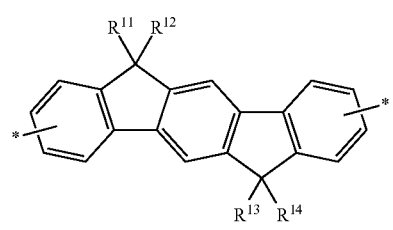
(D109) 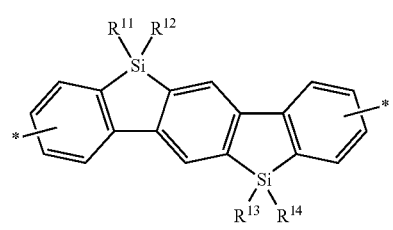
(D110) 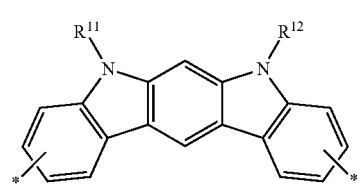
(D111) 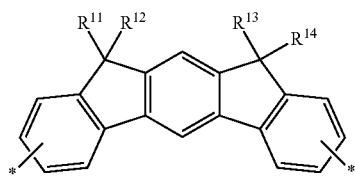
(D112) 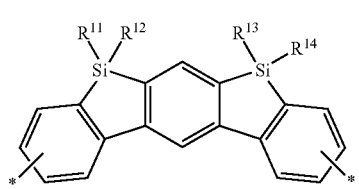
(D113) 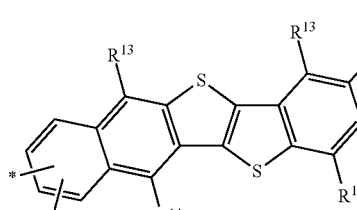
(D114) 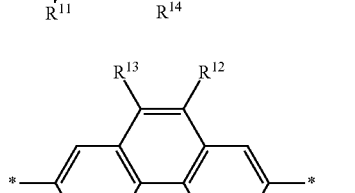
(D115) 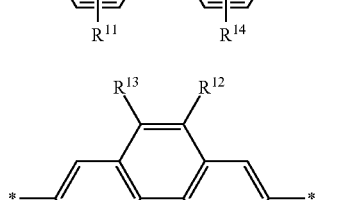
(D116) 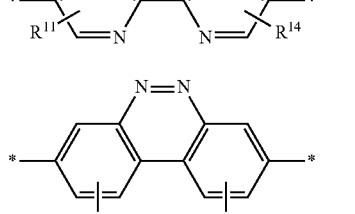
(D118) 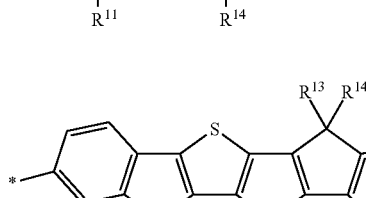
(D119) 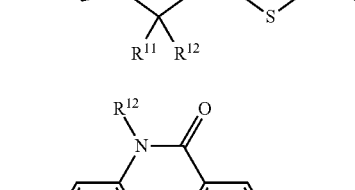
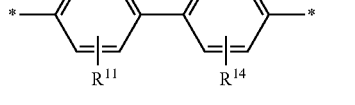

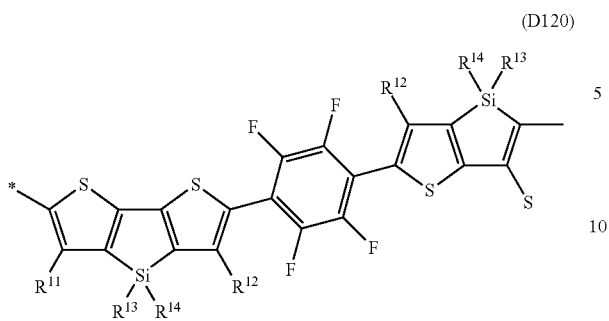
(D120)

wherein one of $X^{11}$ and $X^{12}$ is S and the other is Se, and $R^{11}$, $R^{12}$, $R^{13}$, $R^{14}$, $R^{15}$, $R^{16}$, $R^{17}$ and $R^{18}$ are independently of each other selected from the group consisting of hydrogen, F, Br, Cl, —CN, —NC, —NCO, —NCS, —OCN, —SCN, —C(O)NR$^2$R$^3$, —C(O)X$^0$, —C(O)R$^2$, —NH$_2$, —NR$^2$R$^3$, —SH, —SR$^2$, —SO$_3$H, —SO$_2$R$^2$, —OH, —NO$_2$, —CF$_3$, —SF$_5$, optionally substituted silyl or hydrocarbyl with 1 to 40 C atoms that is optionally substituted and optionally comprises one or more hetero atoms, or P-Sp-as defined herein, and $R^2$, $R^3$ and $X^0$ are as defined above.

Preferred examples of aryl and heteroaryl with electron acceptor properties are selected from the group consisting of the following formulae

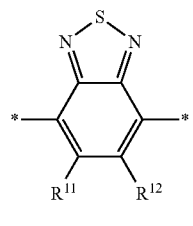
(A1)

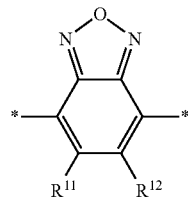
(A2)

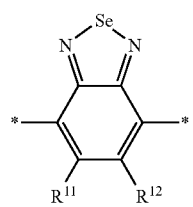
(A3)

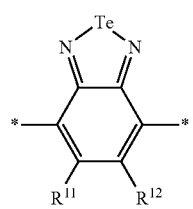
(A4)

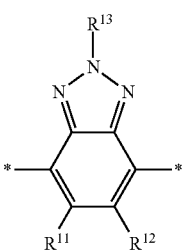
(A5)

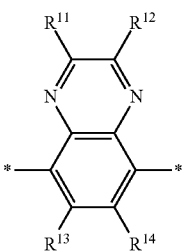
(A6)

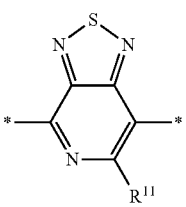
(A7)

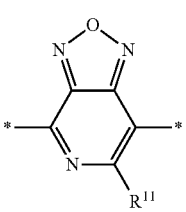
(A8)

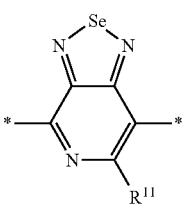
(A9)

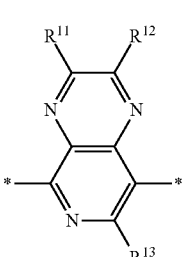
(A10)

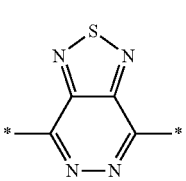
(A11)

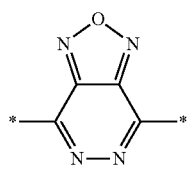 (A12)
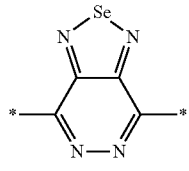 (A13)
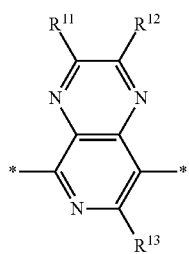 (A14)
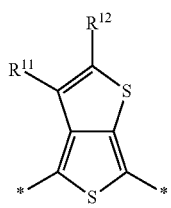 (A15)
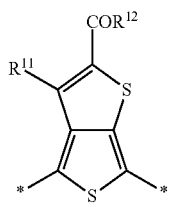 (A16)
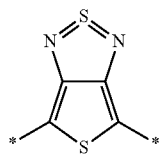 (A17)
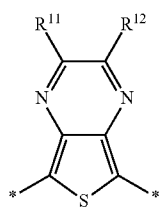 (A18)
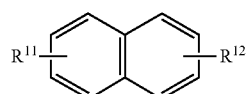 (A19)
 (A20)
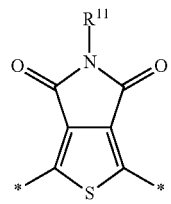 (A21)
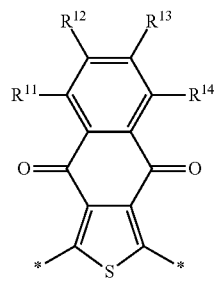 (A22)
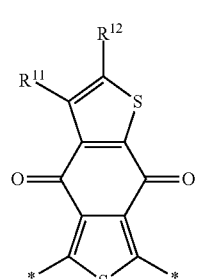 (A23)
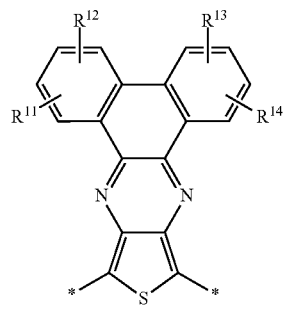

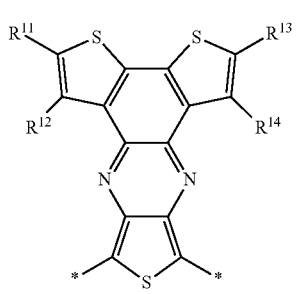 (A24)
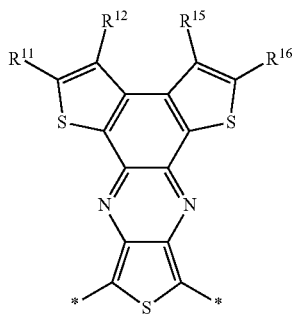 (A25)
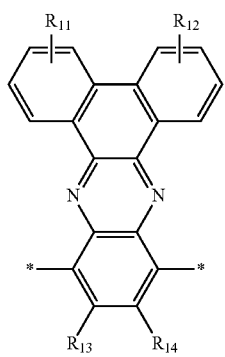 (A26)
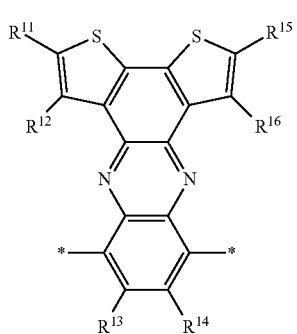 (A27)
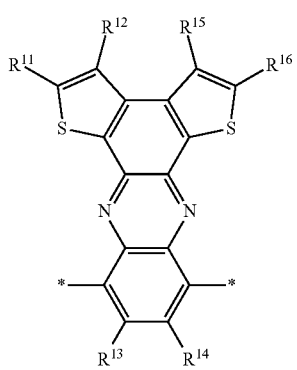 (A28)
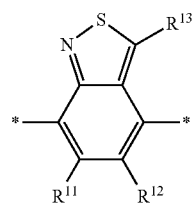 (A29)
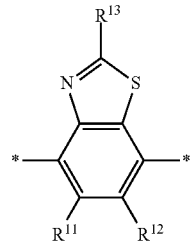 (A30)
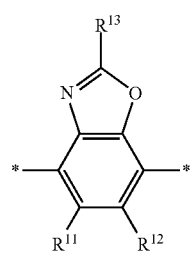 (A31)
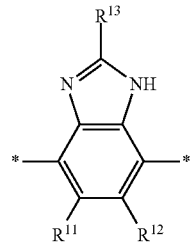 (A32)
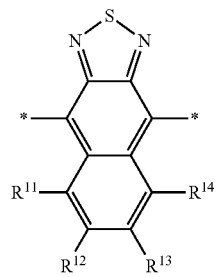 (A33)
(A34)

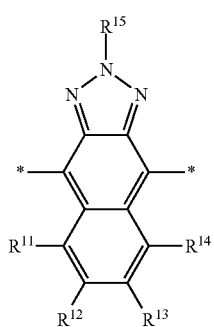 (A35)
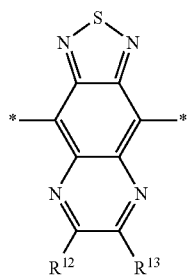 (A36)
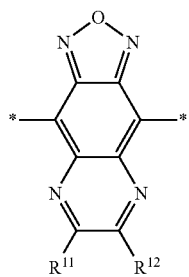 (A37)
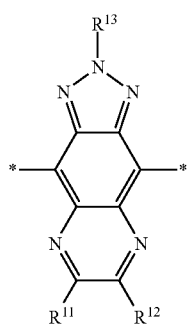 (A38)
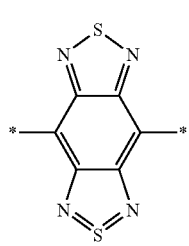 (A39)
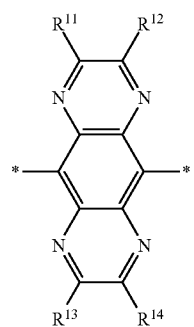 (A40)
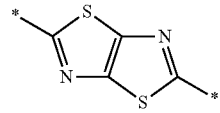 (A41)
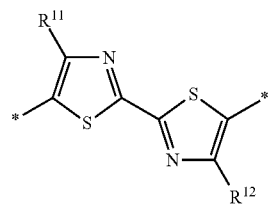 (A42)
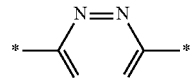 (A43)
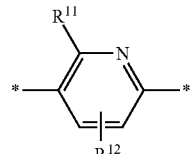 (A44)
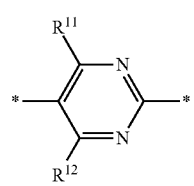 (A45)
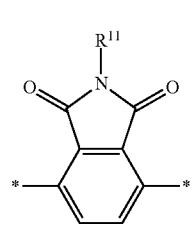 (A46)
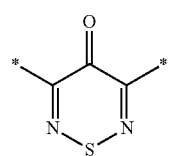 (A47)

(A48)
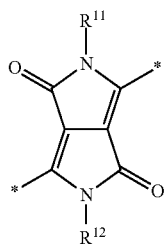
(A49)
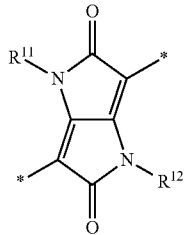
(A50)
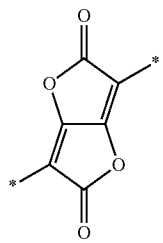
(A51)
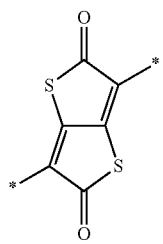
(A52)
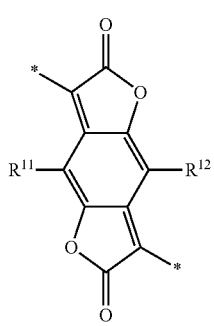
(A53)
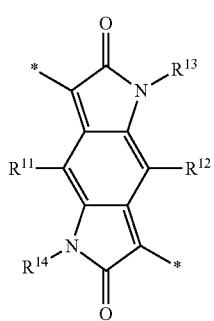
(A54)
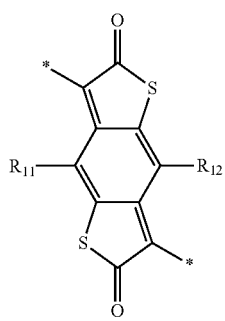
(A55)
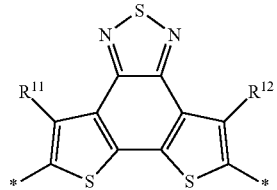
(A56)
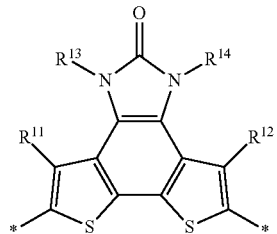
(A57)
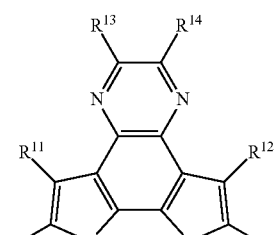
(A58)
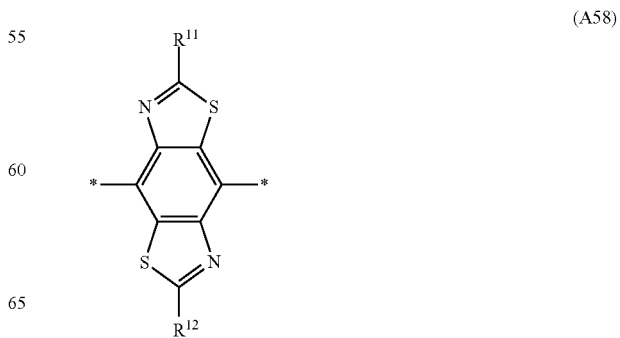

(A59) 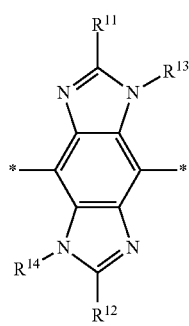
(A60) 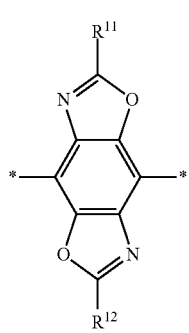
(A61) 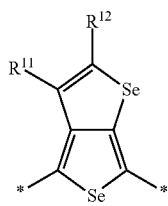
(A62) 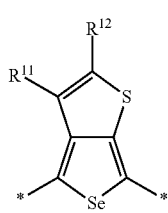
(A63) 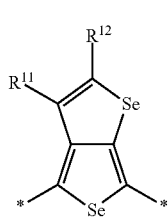
(A64) 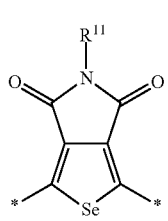
(A65) 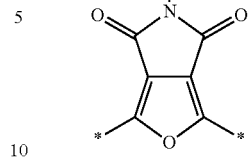
(A66) 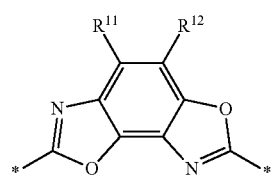
(A67) 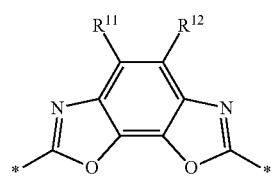
(A68) 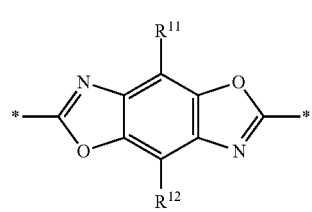
(A69) 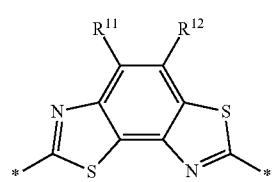
(A70) 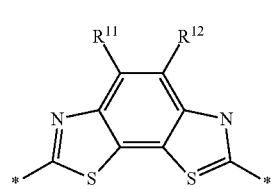
(A71) 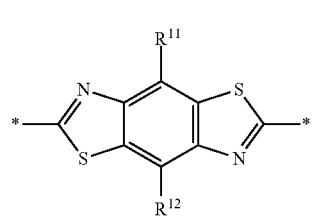
(A72) 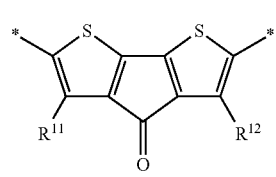

-continued
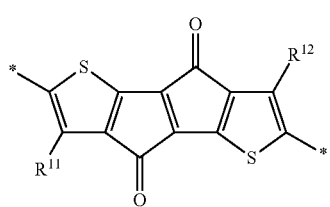
(A73)
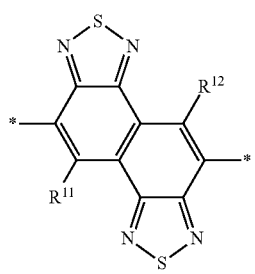
(A74)
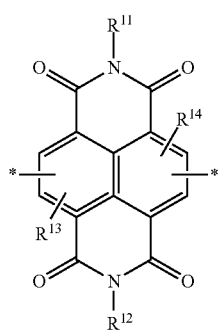
(A75)
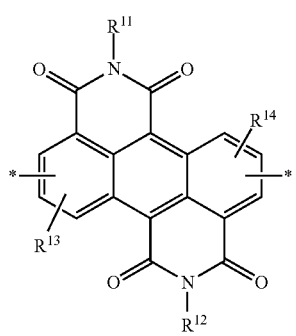
(A76)
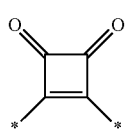
(A77)
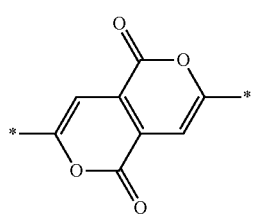
(A78)
-continued
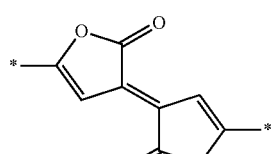
(A79)
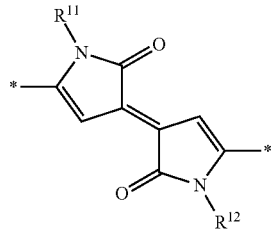
(A80)
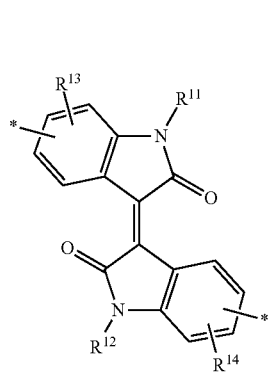
(A81)
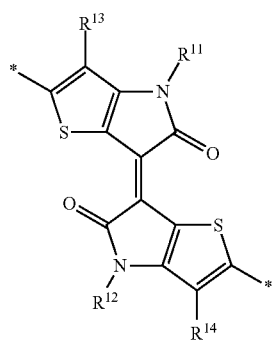
(A82)
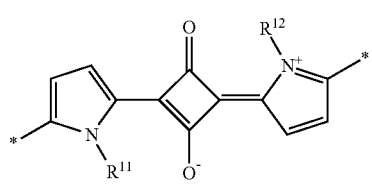
(A83)

(A84) 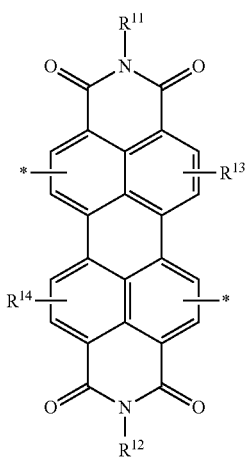

(A85) 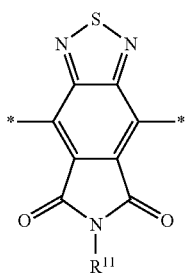

(A86) 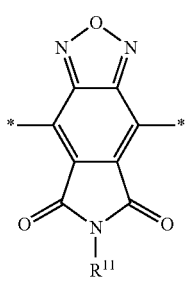

(A87) 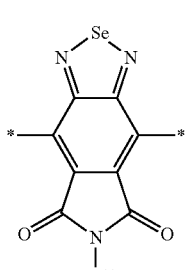

(A88) 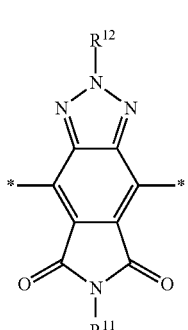

(A89) 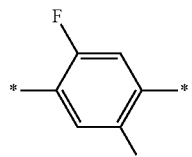

(A90) 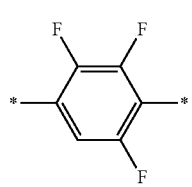

(A91) 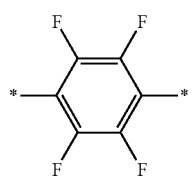

(A92) 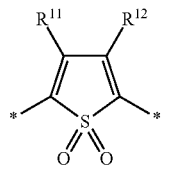

(A93) 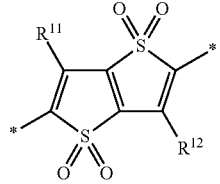

wherein one of $X^{11}$ and $X^{12}$ is S and the other is Se, and $R^{11}$, $R^{12}$, $R^{13}$, $R^{14}$ and $R^{15}$ are independently of each other selected from the group consisting of hydrogen, F, Br, Cl, —CN, —NC, —NCO, —NCS, —OCN, —SCN, —C(O)NR$^2$R$^3$, —C(O)X$^0$, —C(O)R$^2$, —NH$_2$, —NR$^2$R$^3$, —SH, —SR$^2$, —SO$_3$H, —SO$_2$R$^2$, —OH, —NO$_2$, —CF$_3$, —SF$_5$, optionally substituted silyl or hydrocarbyl with 1 to 40 C atoms that is optionally substituted and optionally comprises one or more hetero atoms, or P-Sp-as defined herein, and R$^2$, R$^3$ and X$^0$ are as defined above.

Further preferred homo- and copolymers are selected from the following formulae:

  IVa

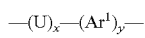  IVb

  IVc wherein U and Ar$^1$ are as defined in formula II, and n, x and y are as defined in formula IV.

Further preferred are polymers of formula IVa, IVb and IVc wherein U is as defined above, and Ar$^1$ is selected from the group consisting formulae H1 to H6

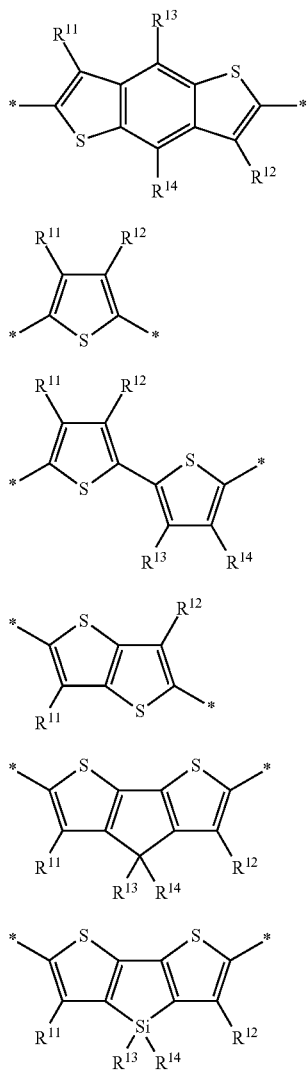

(H1)
(H2)
(H3)
(H4)
(H5)
(H6)

wherein $R^{11}$, $R^{12}$, $R^{13}$ and $R^{14}$ are independently of each other selected from the group consisting of hydrogen, F, Br, Cl, —CN, —NC, —NCO, —NCS, —OCN, —SCN, —C(O)NR$^2$R$^3$, —C(O)X$^0$, —C(O)R$^2$, —NH$_2$, —NR$^2$R$^3$, —SH, —SR$^2$, —SO$_3$H, —SO$_2$R$^2$, —OH, —NO$_2$, —CF$_3$, —SF$_5$, optionally substituted silyl or hydrocarbyl with 1 to 40 C atoms that is optionally substituted and optionally comprises one or more hetero atoms, or P-Sp- as defined herein, and $R^2$, $R^3$ and $X^0$ are as defined above.

Further preferred are repeating units, monomers and polymers of formulae I-VI and their subformulae characterized by one or more of the following preferred or alternative aspects provided that such aspects are not mutually exclusive:

y is >0 and <1 and z is 0,
y is >0 and <1 and z is >0 and <1,
n is at least 5, preferably at least 10, very preferably at least 50, and up to 2,000, preferably up to 500.
$M_w$ is at least 5,000, preferably at least 8,000, very preferably at least 10,000, and preferably up to 300,000, very preferably up to 100,000,
$R^2$ and $R^3$ denote phenyl which is mono- or polysubstituted, and preferably monosubstituted in 4-position, by substituents selected from straight-chain or branched alkyl with 1 to 20 C atoms that is optionally fluorinated,
all groups $R^S$ denote H,
at least one group $R^S$ is different from H,
$R^S$ is selected, on each occurrence identically or differently, from the group consisting of primary alkyl with 1 to 30 C atoms, secondary alkyl with 3 to 30 C atoms, and tertiary alkyl with 4 to 30 C atoms, wherein in all these groups one or more H atoms are optionally replaced by F,
$R^S$ is selected, on each occurrence identically or differently, from the group consisting of aryl and heteroaryl, each of which is optionally fluorinated, alkylated or alkoxylated and has 4 to 30 ring atoms,
$R^S$ is selected, on each occurrence identically or differently, from the group consisting of aryl and heteroaryl, each of which is optionally fluorinated, or alkylated and has 4 to 30 ring atoms,
$R^S$ is selected, on each occurrence identically or differently, from the group consisting of primary alkoxy or sulfanylalkyl with 1 to 30 C atoms, secondary alkoxy or sulfanylalkyl with 3 to 30 C atoms, and tertiary alkoxy or sulfanylalkyl with 4 to 30 C atoms, wherein in all these groups one or more H atoms are optionally replaced by F,
$R^S$ is selected, on each occurrence identically or differently, from the group consisting of aryloxy and heteroaryloxy, each of which is optionally alkylated or alkoxylated and has 4 to 30 ring atoms,
$R^S$ is selected, on each occurrence identically or differently, from the group consisting of alkylcarbonyl, alkoxycarbonyl and alkylcarbonyloxy, all of which are straight-chain or branched, are optionally fluorinated, and have from 1 to 30 C atoms,
$R^S$ denotes, on each occurrence identically or differently, F, Cl, Br, I, CN, $R^9$, —C(O)—R$^9$, —C(O)—O—R$^9$, or —O—C(O)—R$^9$, —SO$_2$—R$^9$, —SO$_3$—R$^9$, wherein $R^9$ is straight-chain, branched or cyclic alkyl with 1 to 30 C atoms, in which one or more non-adjacent C atoms are optionally replaced by —O—, —S—, —C(O)—, —C(O)—O—, —O—C(O)—, —O—C(O)—O—, —SO$_2$—, —SO$_3$—, —CR$^0$=CR$^{00}$— or —C≡C— and in which one or more H atoms are optionally replaced by F, Cl, Br, I or CN, or $R^9$ is aryl or heteroaryl having 4 to 30 ring atoms which is unsubstituted or which is substituted by one or more halogen atoms or by one or more groups $R^2$ as defined above,
$R^0$ and $R^{00}$ are selected from H or $C_1$-$C_{10}$-alkyl,
$R^5$ and $R^6$ are independently of each other selected from H, halogen, —CH$_2$Cl, —CHO, —CH=CH$_2$—SiR'R"R''', —SnR'R"R''', —BR'R", —B(OR')(OR"), —B(OH)$_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, preferably phenyl,
$R^7$ and $R^8$ are independently of each other selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^4$)$_2$, —C≡CH, C≡CSi(Z$^1$)$_3$, —ZnX$^0$ and —Sn(Z$^4$)$_3$, wherein $X^0$ is halogen, $Z^{1-4}$ are selected from the group consisting of alkyl and aryl, each being optionally substituted, and two groups $Z^2$ may also form a cyclic group.

Synthesis of Polymer

The polymers of the present invention can be synthesized according to or in analogy to methods that are known to the skilled person and are described in the literature. Other methods of preparation can be taken from the examples. For example, the polymers can be suitably prepared by aryl-aryl coupling reactions, such as Yamamoto coupling, Suzuki coupling, Stille coupling, Sonogashira coupling, Heck coupling or Buchwald coupling. Suzuki coupling, Stille coupling and Yamamoto coupling are especially preferred. The monomers which are polymerised to form the repeat units of the polymers can be prepared according to methods which are known to the person skilled in the art.

Thus, the process for preparing the present polymers comprises the step of coupling monomers, therein comprised a monomer comprising the divalent unit of formula I, said monomers comprising at least one functional monovalent group selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$, wherein X$^0$ is halogen, and Z$^0$, Z$^1$, Z$^2$, Z$^3$ and Z$^4$ are independently of each other selected from the group consisting of alkyl and aryl, each being optionally substituted, and two groups Z$^2$ may also together form a cyclic group.

Preferably the polymers are prepared from monomers of formula VIa or VIb or their preferred subformulae as described above and below.

Another aspect of the invention is a process for preparing a polymer by coupling one or more identical or different monomeric units of formula I or monomers of formula VIa or VIb with each other and/or with one or more co-monomers in a polymerisation reaction, preferably in an aryl-aryl coupling reaction.

Suitable and preferred comonomers are selected from the following formulae

  VIII

  IX

  X wherein Ar$^1$, Ar$^2$, Ar$^3$, a and c have one of the meanings of formula IIa or one of the preferred meanings given above and below, A$^c$ has one of the meanings of formula IIIa or one of the preferred meanings given above and below, and R$^7$ and R$^8$ have one of meanings of formula VI or one of the preferred meanings given above and below.

Very preferred is a process for preparing a polymer by coupling one or more monomers selected from formula VIa or VIb with one or more monomers of formula VIII, and optionally with one or more monomers selected from formula IX and X, in an aryl-aryl coupling reaction, wherein preferably R$^7$ and R$^8$ are selected from Cl, Br, I, —B(OZ$^2$)$_2$ and —Sn(Z$^4$)$_3$.

For example, preferred embodiments of the present invention relate to a) a process of preparing a polymer by coupling a monomer of formula VI1

  VI1 with a monomer of formula IX

  IX in an aryl-aryl coupling reaction; or
b) a process of preparing a polymer by coupling a monomer of formula VI2

  VI2 with a monomer of formula VIII1

R$^7$—Ar$^1$-A$^c$-Ar$^2$—R$^8$  VIII1 in an aryl-aryl coupling reaction; or
c) a process of preparing a polymer by coupling a monomer of formula VI2

R$^7$—U—R$^8$  VI2 with a monomer of formula VIII-2

R$^7$-A$^c$-R$^8$  VIII2 in an aryl-aryl coupling reaction; or
d) a process of preparing a polymer by coupling a monomer of formula VI2

R$^7$—U—R$^8$  VI2 with a monomer of formula VIII2

R$^7$-A-R$^8$  VIII2 and a monomer of formula IX

R$^7$—Ar$^1$—R$^8$  IX in an aryl-aryl coupling reaction; or
e) a process of preparing a polymer by coupling a monomer of formula VI1

R$^7$—U—Ar$^1$—U—R$^8$  VI5 with a monomer of formula IX

R$^7$—Ar$^1$—R$^8$  IX in an aryl-aryl coupling reaction; or
f) a process of preparing a polymer by coupling a monomer of formula VI2

R$^7$—U—R$^8$  VI2 with a monomer of formula IX

R$^7$—Ar$^1$—R$^8$  IX and a monomer of formula X

R$^7$—Ar$^3$—R$^8$  X in an aryl-aryl coupling reaction,
wherein R$^7$, R$^8$, U, A$^c$, Ar$^{1,2,3}$ are as defined in formula IIa, IIIa and VIa, and R$^7$ and R$^8$ are preferably selected from Cl, Br, I, —B(OZ$^2$)$_2$ and —Sn(Z$^4$)$_3$ as defined in formula VIa.

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling Yamamoto coupling and C—H activation coupling. Suzuki coupling is described for example in WO 00/53656 A1. Negishi coupling is described for example in J. Chem. Soc., Chem. Commun., 1977, 683-684. Yamamoto coupling is described for example in T. Yamamoto et al., Prog. Polym. Sci., 1993, 17, 1153-1205, or WO 2004/022626 A1, Stille coupling is described for example in Z. Bao et al., J. Am. Chem. Soc., 1995, 117, 12426-12435 and C—H activation polymerisation, as described for example in M. Leclerc et al, Angew. Chem. Int. Ed. 2012, 51, 2068-2071. For example, when using Yamamoto coupling, monomers having two reactive halide groups are preferably used. When using Suzuki coupling, compounds of formula II having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used. When using C—H activation coupling, monomers having two activated C—H groups or two reactive halide groups are preferably used.

Preferred catalysts, especially for Suzuki, Negishi, Stille coupling or C—H activation, are selected from Pd(0) complexes or Pd(II) salts. Preferred Pd(0) complexes are those bearing at least one phosphine ligand such as $Pd(Ph_3P)_4$. Another preferred phosphine ligand is tris(ortho-tolyl)phosphine, i.e. $Pd(o\text{-}ToI_3P)_4$. Preferred Pd(II) salts include palladium acetate, i.e. $Pd(OAc)_2$ or trans-di(u-acetato)-bis[o-(di-o-tolylphosphino)benzyl]dipalladium(II). Alternatively the Pd(0) complex can be prepared by mixing a Pd(0) dibenzylideneacetone complex, for example tris(dibenzylideneacetone)dipalladium(0), bis(dibenzylideneacetone)palladium(O), or Pd(II) salts e.g. palladium acetate, with a phosphine ligand, for example triphenylphosphine, tris(ortho-tolyl)phosphine, tris(o-methoxyphenyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl) nickel(0).

Suzuki and Stille polymerisation may be used to prepare homopolymers as well as statistical, alternating and block random copolymers. Statistical or block copolymers can be prepared for example from the above monomers of formula VI or its subformulae, wherein one of the reactive groups is halogen and the other reactive group is a boronic acid, boronic acid derivative group or and alkylstannane. The synthesis of statistical, alternating and block copolymers is described in detail for example in WO 03/048225 A2 or WO 2005/014688 A2.

As alternatives to halogens as described above, leaving groups of formula $-O-SO_2Z^1$ can be used wherein $Z^1$ is as described above. Particular examples of such leaving groups are tosylate, mesylate and triflate.

Especially suitable and preferred synthesis methods of the repeating units, monomers and polymers of formulae I-VI and their subformulae are illustrated in the synthesis schemes shown hereinafter, wherein $A^1$, $A^2$, $A^3$ and n are as defined above, and Ar and Ar' have one of the meanings of $Ar^1$, $Ar^2$, $Ar^3$ and $A^c$ as given above.

An exemplary synthesis of 4,7-dihalo-5-alkoxy-6-fluoro-benzo[1,2,5]thiadiazole is shown in Scheme 1. The 6-alkoxyl-[1,2,5]thiadiazolo[3,4-c]pyridine can be prepared, for example in a similar way to the one illustrated in Scheme 1 using 2-chloro-5-nitro-pyridin-4-ylamine or 2-fluoro-5-notro-pyridin-4-ylamine as starting compound. More specifically, the preparation of 4,7-dibromo-5-alkoxy-6-fluoro-benzo[1,2,5]thiadiazole is shown in Scheme 2.

Scheme 1 - Ememplary synthesis of 4,7-dihalo-5-alkoxy-6-fluoro-benzo[1,2,5]thiadiazole.

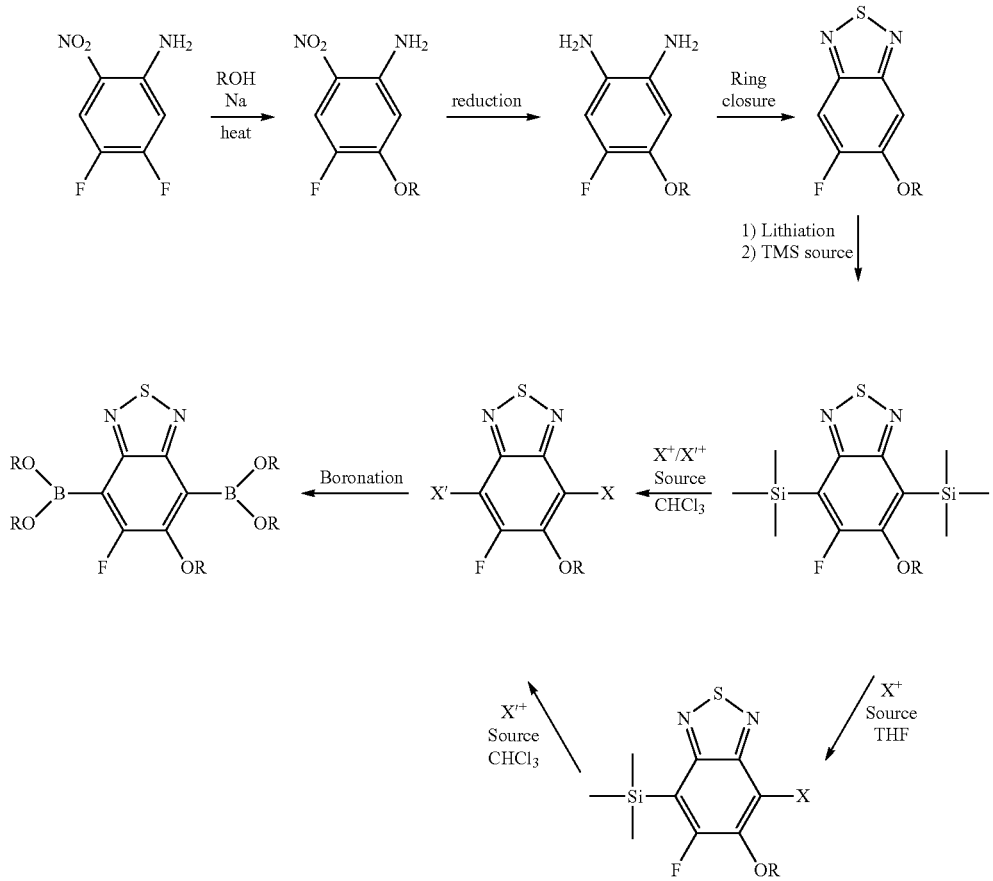

Scheme 2 - Exemplary synthesis of 4,7-dibromo-5-alkoxy-6-fluoro-benzo[1,2,5]thiadiazole.

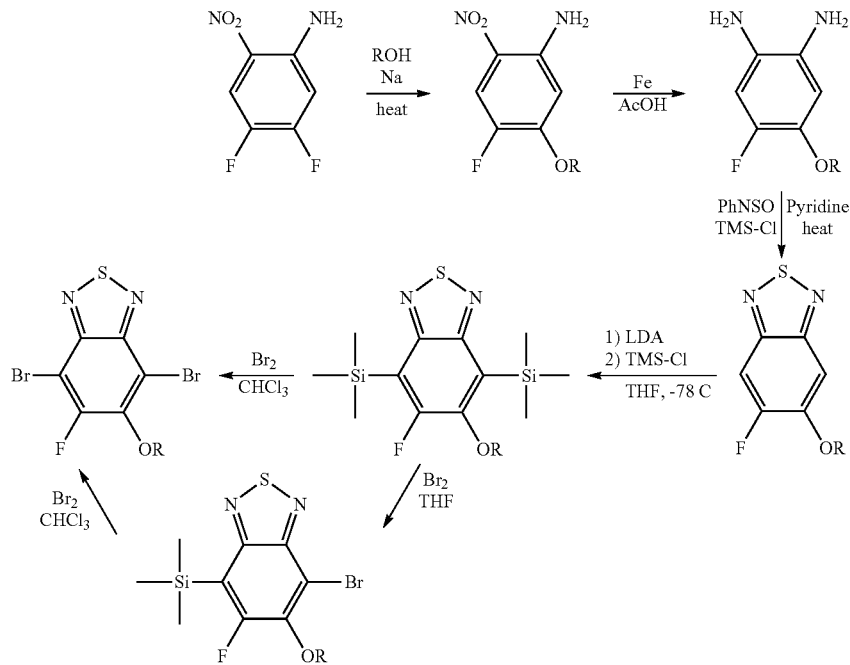

The novel methods of preparing monomers and polymers as described herein are another aspect of the invention.

Statistical block copolymers comprising at least one divalent unit of formula (IIIa) or of formula (IIIb) are prepared from the respective segments U—Ar$^2$, U—Ar$^1$ and Ar$^1$—Ar$^2$ in the respective desired molar ratio.

Blends, Formulations, Devices Etc

The compounds and polymers according to the present invention can also be used in mixtures or polymer blends, for example together with monomeric compounds or together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more small molecules, polymers, mixtures or polymer blends as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, decaline, indane, methyl benzoate, ethyl benzoate, mesitylene and/or mixtures thereof.

The concentration of the compounds or polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in J. D. Crowley et al., *Journal of Paint Technology*, 1966, 38 (496), 296. Solvent blends may also be used and can be identified as described in Solvents, W. H. Ellis, Federation of Societies for Coatings Technology, p. 9-10, 1986. Such a procedure may lead to a blend of 'non' solvents that will dissolve both the polymers of the present invention, although it is desirable to have at least one true solvent in a blend.

The compounds and polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices need to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the compounds or polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a compound or polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymer blends and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The compounds and polymers to the present invention are useful as charge transport, semiconducting, electrically conducting, photoconducting or light emitting materials in optical, electrooptical, electronic, electroluminescent or photoluminescent components or devices. In these devices, the polymers of the present invention are typically applied as thin layers or films.

Thus, the present invention also provides the use of the semiconducting compound, polymer, polymers blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a compound, polymer, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a compound, polymer, polymer blend, formulation or organic semiconducting layer according to the present invention. Especially preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs, OPV and OPD devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material such as zinc oxide ($ZnO_x$), zinc tin oxide (ZTO), titan oxide ($TiO_x$), molybdenum oxide ($MoO_x$), nickel oxide ($NiO_x$), or cadmium selenide (CdSe), or an organic material such as graphene or a fullerene or substituted fullerene, for example an indene-$C_{60}$-fullerene bisaduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

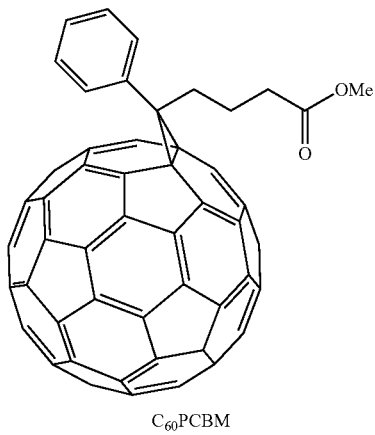 [SMILES: COC(=O)CCCC1(c2ccccc2)C23C=C4CC5=CC6C=C7Cc8cc9cc%10c%11c(c%12c%13c%14c(c4c5c4c%14c5c(c7c8c7c9c%11c%13c57)C46)C%1221)C(=C3)C%10]

$C_{60}$PCBM

Preferably the polymer according to the present invention is blended with an n-type semiconductor such as a fullerene or substituted fullerene, like for example PCBM-$C_{60}$, PCBM-$C_{70}$, PCBM-$C_{61}$, PCBM-$C_{71}$, bis-PCBM-$C_{61}$, bis-PCBM-$C_{71}$, ICMA-$c_{60}$ (1',4'-Dihydro-naphtho[2',3':1,2][5,6]fullerene-$C_{60}$), ICBA-$C_{60}$, oQDM-$C_{60}$ (1',4'-dihydro-naphtho[2',3':1,9][5,6]fullerene-C60-Ih), bis-oQDM-$C_{60}$, graphene, or a metal oxide, like for example, $ZnO_x$, $TiO_x$, ZTO, $MoO_x$, $NiO_x$, or quantum dots like for example CdSe or CdS, to form the active layer in an OPV or OPD device. The device preferably further comprises a first transparent or semi-transparent electrode on a transparent or semi-transparent substrate on one side of the active layer, and a second metallic or semi-transparent electrode on the other side of the active layer.

Further preferably the OPV or OPD device comprises, between the active layer and the first or second electrode, one or more additional buffer layers acting as hole transporting layer and/or electron blocking layer, which comprise a material such as metal oxide, like for example, ZTO, $MoO_x$, $NiO_x$, a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly [(9,9-bis(3'-(N,N-dimethylamino)propyl)-2,7-fluorene)-alt-2,7-(9,9-dioctylfluorene)] or an organic compound, like for example tris(8-quinolinolato)-aluminium(III) ($Alq_3$), 4,7-diphenyl-1,10-phenanthroline.

In a blend or mixture of a polymer according to the present invention with a fullerene or modified fullerene, the ratio polymer:fullerene is preferably from 5:1 to 1:5 by weight, more preferably from 1:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

Suitable solutions or formulations containing the blend or mixture of a polymer according to the present invention with a $C_{60}$ or $C_{70}$ fullerene or modified fullerene like PCBM must be prepared. In the preparation of formulations, suitable solvent must be selected to ensure full dissolution of both component, p-type and n-type and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to chlorobenzene, 1,2-dichlorobenzene, chloroform, 1,2-dichloroethane, dichloromethane, carbon tetrachloride, toluene, cyclohexanone, ethylacetate, tetrahydrofuran, anisole, morpholine, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and combinations thereof.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
- optionally a substrate,
- a high work function electrode, preferably comprising a metal oxide, like for example ITO, serving as anode,
- an optional conducting polymer layer or hole transport layer, preferably comprising an organic polymer or polymer blend, for example of PEDOT:PSS (poly(3,4-ethylenedioxythiophene): poly(styrene-sulfonate), or TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine),
- a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ,
- optionally a layer having electron transport properties, for example comprising LiF,
- a low work function electrode, preferably comprising a metal like for example aluminum, serving as cathode, wherein at least one of the electrodes, preferably the anode, is transparent to visible light, and
wherein the p-type semiconductor is a polymer according to the present invention.

A second preferred OPV device according to the invention is an inverted OPV device and comprises the following layers (in the sequence from bottom to top):
- optionally a substrate,
- a high work function metal or metal oxide electrode, comprising for example ITO, serving as cathode,
- a layer having hole blocking properties, preferably comprising a metal oxide like $TiO_x$ or $Zn_x$,
- an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ,
- an optional conducting polymer layer or hole transport layer, preferably comprising an organic polymer or polymer blend, for example of PEDOT:PSS or TBD or NBD,
- an electrode comprising a high work function metal like for example silver, serving as anode, wherein at least one of the electrodes, preferably the cathode, is transparent to visible light, and
wherein the p-type semiconductor is a polymer according to the present invention.

In the OPV devices of the present invention the p-type and n-type semiconductor materials are preferably selected from the materials, like the polymer/fullerene systems, as described above When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater*, 2004, 14(10), 1005. An optional annealing step may be then necessary to optimize blend morphology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.*, 2007, 6, 497 or Fréchet et al. *J. Am. Chem. Soc.*, 2010, 132, 7595-7597.

The compounds, polymers, formulations and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound, polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. No. 5,892,244, U.S. Pat. No. 5,998,804, U.S. Pat. No. 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
- a source electrode,
- a drain electrode,
- a gate electrode,
- a semiconducting layer,
- one or more gate insulator layers, and
- optionally a substrate, wherein the semiconductor layer preferably comprises a compound, polymer, polymer blend or formulation as described above and below.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the materials according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., Cr, Br, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$, $(BF_4^-)$, $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., *Nat. Photonics,* 2008, 2, 684.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913 A1.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. Sci. U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant £ ("permittivity") refer to values taken at 20° C. and 1,000 Hz.

EXAMPLES

In the following examples the term "ran" in the polymer formulae is used to indicate that the respective unit may be inserted in a random fashion with regards to its orientation.

Example 1.1—5-Dodecyloxy-4-fluoro-2-nitro-phenylamine

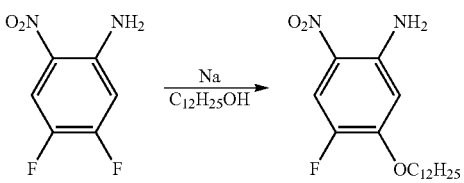

Sodium metal (1.82 g; 79.0 mmol; 1.10 eq.) is added to melted dodecan-1-ol (134 g; 718 mmol; 10.0 eq.) and the reaction heated to 60-70° C. to complete $C_{12}H_{25}ONa$ formation. After hydrogen evolution has stopped, 4,5-difluoro-2-nitro-phenylamine (12.50 g; 71.80 mmol; 1.000 eq.) is added and the reaction mixture heated 3 hours at 100° C. The warm reaction mixture is poured into water and MeOH (1:1, ca. 1.5 dm³) and the precipitate filtered. The dried solid is triturated with petroleum ether (40-60° C.), filtered and dried for 18 hours (18.21 g, Yield: 75%).
$^1$H NMR (300 MHz, CDCl$_3$): δ 7.85 (d, J=11.6 Hz, 1H), 6.18 (d, J=7.2 Hz, 1H), 6.17 (br. s, 2H), 4.02 (t, J=6.6 Hz, 2H), 1.72-1.90 (m, 2H), 1.36-1.59 (m, 4H), 1.21-1.36 (m, 14H), 0.88 (t, J=6.7 Hz, 3H)

Example 1.2—4-Dodecyloxy-5-fluoro-benzene-1,2-diamine

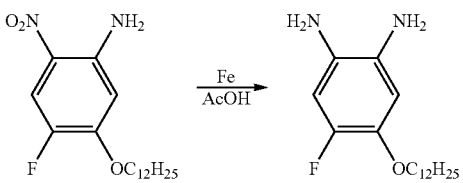

Iron powder (6.890 g; 123.4 mmol; 6.000 eq.) is added in small portions to a solution of 5-dodecyloxy-4-fluoro-2-nitro-phenylamine (7.000 g; 20.56 mmol; 1.000 eq.) in acetic acid (62 cm³). The reaction is stirred seal with a glass stopped for 2 hours at 50° C. and 4 hour at 25° C., cooled down to 0° C. and an aqueous ammonia solution (>25% w/w) (156 cm³; 100.000 eq.) is added dropwise to reach pH 10 while maintaining the temperature inside the flask below 50° C. The resulting mixture is extracted with ethyl acetate (3×250 cm³) and the combined organic fractions dried over sodium sulfate. The solvent is removed in vacuo and the resulting product used without further purification (5.27 g, Yield: 83%).
$^1$H NMR (300 MHz, CDCl$_3$): δ 6.49 (d, J=11.9 Hz, 1H), 6.40 (d, J=8.0 Hz, 1H), 5.37 (br. s, 2H), 3.92 (t, J=6.7 Hz, 2H), 3.25 (br. s., 2H), 1.57-1.88 (m, 2H), 1.36-1.53 (m, 2H), 1.27 (s, 16H), 0.89 (t, J=6.5 Hz, 3H)

Example 1.3—5-Dodecyloxy-6-fluoro-benzo[1,2,5]thiadiazole

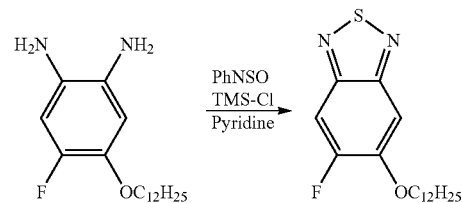

To a stirred solution of 4-dodecyloxy-5-fluoro-benzene-1,2-diamine (5.000 g; 16.11 mmol; 1.000 eq.) in dry pyridine (52 cm³) is added thionylaniline (2.18 ml; 19.3 mmol; 1.20 eq.) and chlorotrimethylsilane (4.91 ml; 38.7 mmol; 2.40 eq.). The reaction mixture is further stirred at 70° C. for 18 hours than poured into saturated aqueous solution of NaHCO$_3$. The aqueous phase is extracted with dichloromethane (3×45 cm³), the combined organic fraction dried over magnesium sulfate and the solvent removed in vacuo. The recovered oil is purified by column chromatography using a solvent gradient of petroleum ether (40-60° C.) and ethyl acetate from 0:100 to 90:10 (4.05 g, Yield: 74%).
$^1$H NMR (300 MHz, CDCl$_3$): δ 7.59 (d, J=10.5 Hz, 1H), 7.27 (d, J=8.0 Hz, 1H), 4.14 (t, J=6.5 Hz, 2H), 1.87-1.98 (m, 2H), 1.49-1.58 (m, 2H), 1.22-1.40 (m, 16H), 0.84-0.93 (t, J=6.8 Hz, 3H)

Example 1.4—4,7-Dibromo-5-dodecyloxy-6-fluoro-benzo[1,2,5]thiadiazole

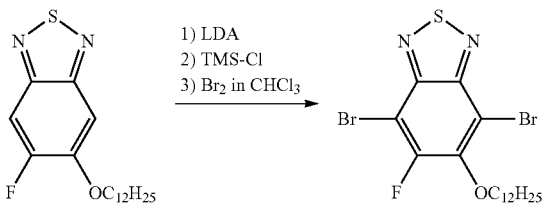

5-Fluoro-6-octyloxy-benzo[1,2,5]thiadiazole (3.700 g; 13.1030 mmol; 1.000 eq.) is dissolved in dry tetrahydrofuran (133 cm³) and the resulting solution cooled to −78° C. A solution of 1.8 M of lithium diisopropylamine in tetrahydrofuran/heptanes/ethylbenzene (18.2 cm³; 32.8 mmol; 2.50 eq.) is added dropwise over 15 to 20 minutes. After 30 minutes, chlorotrimethylsilane (5.00 cm³; 39.3 mmol; 3.00 eq.) is added in one portion and the reaction mixture further stirred at −78° C. for 30 minutes and 25° C. for 18 hours. The crude mixture is poured into water, extracted with diethyl ether (3×100 cm³), the combined organic fraction dried over magnesium sulfate and the solvent removed in vacuo. The crude product is dissolved into chloroform (112 cm³) and bromine (1.42 cm³; 27.7 mmol; 2.20 eq.) is added in one portion. The reaction is stirred 18 hours in absence of light at 25° C. before adding more bromine (2.58 cm³; 50.4 mmol; 4.00 eq.). The reaction mixture is further stirred at 25° C. for 72 hours in absence of light, poured into a saturated aqueous solution of sodium thiosulfate and extracted with dichloromethane (3×125 cm³). The crude compound is purified by column chromatography using a solvent gradient of petroleum ether (40-60° C.) and ethyl acetate from 0:100 to 90:10 and recrystallised twice in a methanol and tetrahydrofuran mixture (3.71 g, Yield: 59%).

¹H NMR (300 MHz, CDCl₃): δ 4.24 (td, J=6.5, 0.8 Hz, 2H), 1.85-1.95 (m, 2H), 1.49-1.61 (m, 2H), 1.22-1.40 (m, 16H), 0.89 (t, J=6.6 Hz, 3H)

Example 1.5—Polymer 1

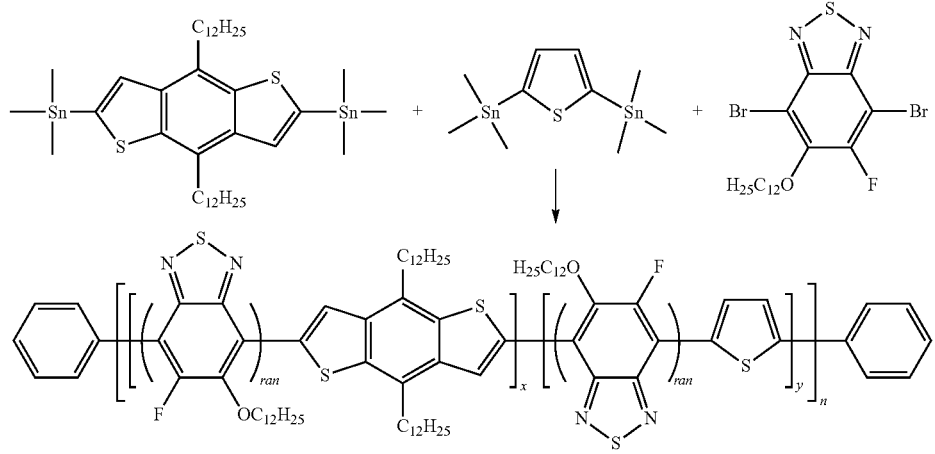

4,8-Didodecyl-2,6-bis-trimethylstannanyl-benzo[1,2-b;4,5-b]dithiophene (341.0 mg; 0.4000 mmol; 1.000 eq.), 4,7-dibromo-5-dodecyloxy-6-fluoro-benzo[1,2,5]thiadiazole (397.0 mg; 0.8000 mmol; 2.000 eq.), 2,-5-bis-trimethylstannanyl-thiophene (163.9 mg; 0.4000 mmol; 1.000 eq.) and tetrakis(triphenylphosphine)palladium(0) (37.0 mg; 32.0 µmol; 0.0800 eq.) are transferred into a 5 cm³ microwave vial. Degassed toluene (4.0 cm³) and N,N'-dimethylformamide (1.0 cm³) are added, and the mixture is then further purged with nitrogen for 5 minutes. The reaction mixture is placed in a microwave reactor (Biotage Initiator) and heated sequentially at 140° C. (60 seconds), 160° C. (60 seconds) and 180° C. (3600 seconds). Immediately after completion of the reaction, the reaction is allowed to cool to 65° C., tributyl-phenyl-stannane (0.26 cm³; 0.80 mmol; 2.0 eq.) is added and the mixture heated back to 180° C. (600 seconds). Immediately after completion of the first end-capping reaction, the reaction is allowed to cool to 65° C., bromobenzene (0.13 cm³; 1.2 mmol; 3.0 eq.) is added and the mixture heated back to 180° C. (600 seconds). Immediately after the second end-capping reaction, the reaction mixture is allowed to cool to 65° C. and precipitated into stirred methanol (100 cm³) with methanol washings (2×10 cm³) of the reaction tube. The polymer is collected by filtration, washed with methanol (100 cm³) to give a black solid and subjected to Soxhlet extraction with acetone, petroleum ether (40-60° C.), cyclohexane and chloroform. Methanol (200 cm³) is added dropwise to the chloroform fraction (150 cm³) and the resulting precipitate collected by filtration and dried in vacuo to give a black solid (465 mg, Yield: 91%).

GPC (140° C., 1,2,4-trichlorobenzene): $M_n$=16.7 kg mol⁻¹; $M_w$=37.6 kg mol⁻¹; PDI=2.26.

Example 2—Polymer 2

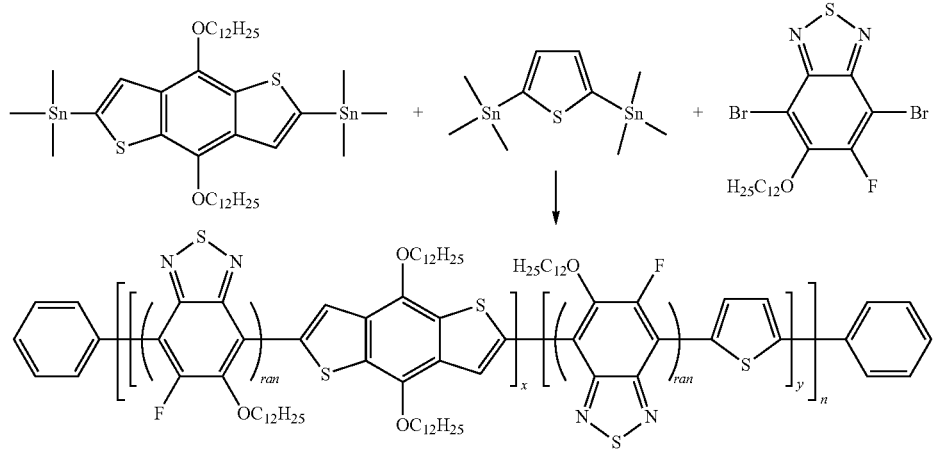

4,8-Bis-dodecyloxy-2,6-bis-trimethylstannanyl-benzo[1,2-b;4,5-b]dithiophene (353.8 mg; 0.4000 mmol; 1.000 eq.), 4,7-dibromo-5-dodecyloxy-6-fluoro-benzo[1,2,5]thiadiazole (397.0 mg; 0.8000 mmol; 2.000 eq.), 2,-5-bis-trimethylstannanyl-thiophene (163.9 mg; 0.4000 mmol; 1.000 eq.) and tetrakis(triphenylphosphine)palladium(0) (37.0 mg; 32.0 µmol; 0.0800 eq.) are transferred into a 5 cm³ microwave vial. Degassed toluene (4.0 cm³) and N,N'-dimethylformamide (1.0 cm³) are added, and the mixture is then further purged with nitrogen for 5 minutes. The reaction mixture is placed in a microwave reactor (Biotage Initiator) and heated sequentially at 140° C. (60 seconds), 160° C. (60 seconds) and 180° C. (3600 seconds). Immediately after completion of the reaction, the reaction is allowed to cool to 65° C., tributyl-phenyl-stannane (0.26 cm³; 0.80 mmol; 2.0 eq.) is added and the mixture heated back to 180° C. (600 seconds). Immediately after completion of this first end-capping reaction, the reaction is allowed to cool to 65° C., bromobenzene (0.13 cm³; 1.2 mmol; 3.0 eq.) is added and the mixture heated back to 180° C. (600 seconds). Immediately after the second end-capping reaction, the reaction mixture is allowed to cool to 65° C. and precipitated into stirred methanol (100 cm³) with methanol washings (2×10 cm³) of the reaction tube. The polymer is collected by filtration, washed with methanol (100 cm³) to give a black solid and subjected to Soxhlet extraction with acetone, petroleum ether (40-60° C.), cyclohexane and chloroform. Methanol (200 cm³) is added dropwise to the chloroform fraction (150 cm³) and the resulting precipitate collected by filtration and dried in vacuo to give a black solid (410 mg, Yield: 78%).

GPC (140° C., 1,2,4-trichlorobenzene): $M_n$=9.9 kg mol⁻¹; $M_w$=27.2 kg mol⁻¹; PDI=2.75.

4,8-Didodecyl-2,6-bis-trimethylstannanyl-benzo[1,2-b;4,5-b]dithiophene (341.0 mg; 0.4000 mmol; 1.000 eq.), 4,7-dibromo-5-dodecyloxy-6-fluoro-benzo[1,2,5]thiadiazole (198.5 mg; 0.4000 mmol; 1.000 eq.), 4,7-Dibromo-5,6-bis-dodecyloxy-benzo[1,2,5]thiadiazole (265.0 mg; 0.4000 mmol; 1.000 eq.), 2,-5-bis-trimethylstannanyl-thiophene (163.9 mg; 0.4000 mmol; 1.000 eq.) and tetrakis(triphenylphosphine)palladium(0) (37.0 mg; 32.0 µmol; 0.0800 eq.) are transferred into a 5 cm³ microwave vial. Degassed toluene (4.0 cm³) and N,N'-dimethylformamide (1.0 cm³) are added, and the mixture is then further purged with nitrogen for 5 minutes. The reaction mixture is placed in a microwave reactor (Biotage Initiator) and heated sequentially at 140° C. (60 seconds), 160° C. (60 seconds) and 180° C. (3600 seconds). Immediately after completion of the reaction, the reaction is allowed to cool to 65° C., tributyl-phenyl-stannane (0.26 cm³; 0.80 mmol; 2.0 eq.) is added and the mixture heated back to 180° C. (600 seconds). Immediately after completion of this first end-capping reaction, the reaction is allowed to cool to 65° C., bromobenzene (0.13 cm³; 1.2 mmol; 3.0 eq.) is added and the mixture heated back to 180° C. (600 seconds). Immediately after the second end-capping reaction, the reaction mixture is allowed to cool to 65° C. and precipitated into stirred methanol (100 cm³) with methanol washings (2×10 cm³) of the reaction tube. The polymer is collected by filtration, washed with methanol (100 cm³) to give a black solid and subjected to Soxhlet extraction with acetone, petroleum ether (40-60° C.), cyclohexane and chloroform. Methanol (200 cm³) is added dropwise to the chloroform fraction (150 cm³) and the resulting precipitate collected by filtration and dried in vacuo to give a black solid (495 mg, Yield: 86%).

GPC (140° C., 1,2,4-trichlorobenzene): $M_n$=10.3 kg mol⁻¹; $M_w$=18.8 kg mol⁻¹; PDI=1.81.

Example 3—Polymer 3

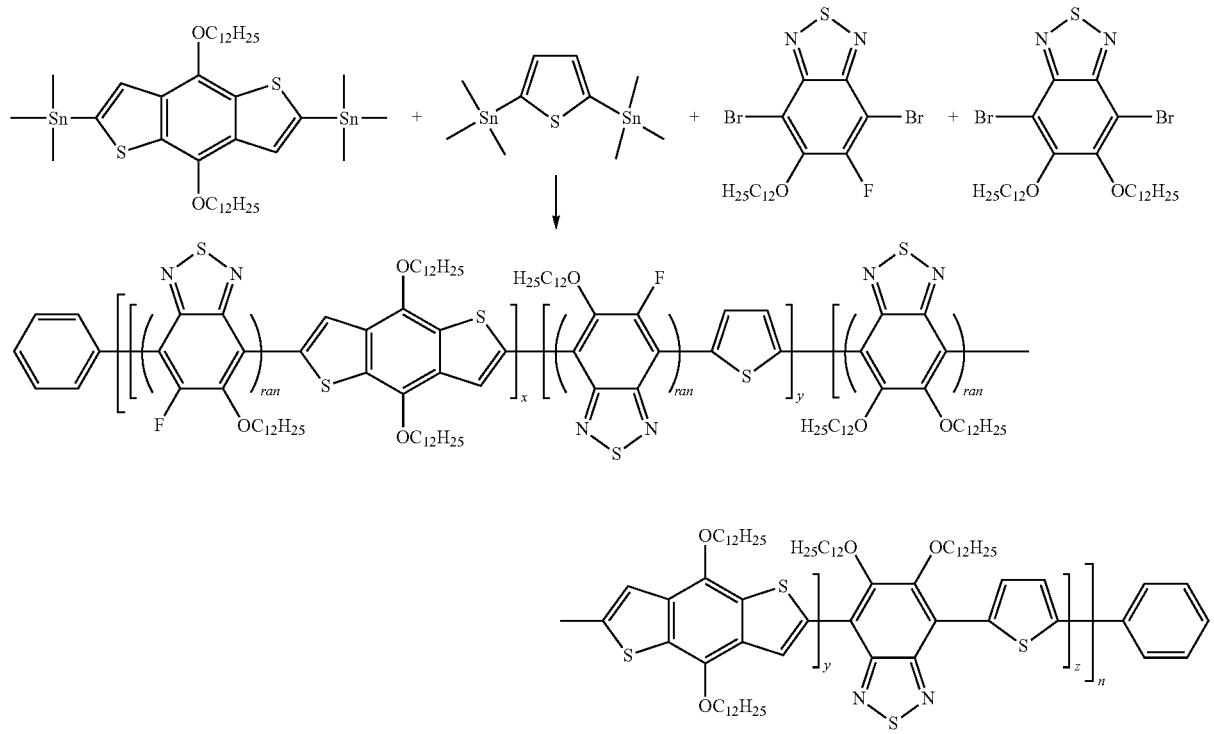

Example 4—Photovoltaic Cell Fabrication and Measurement

Organic photovoltaic (OPV) devices were fabricated on pre-patterned ITO-glass substrates (13 Ω/sq.) purchased from LUMTEC Corporation. Substrates were cleaned using common solvents (acetone, iso-propanol, deionized-water) in an ultrasonic bath. A conducting polymer poly(ethylene dioxythiophene) doped with poly(styrene sulfonic acid) [Clevios VPAI 4083 (H.C. Starck)] was mixed in a 1:1 ratio with deionized-water. This solution was filtered using a 0.45 μm filter before spin-coating to achieve a thickness of 20 nm. Substrates were exposed to ozone prior to the spin-coating process to ensure good wetting properties. Films were then annealed at 140° C. for 30 minutes in a nitrogen atmosphere where they were kept for the remainder of the process. Active material solutions (i.e. polymer+PCBM) were prepared and stirred overnight to fully dissolve the solutes. Thin films were either spin-coated or blade-coated in a nitrogen atmosphere to achieve active layer thicknesses between 100 and 500 nm as measured using a profilometer. A short drying period followed to ensure removal of any residual solvent.

Typically, spin-coated films were dried at 23° C. for 10 minutes and blade-coated films were dried at 70° C. for 2 minutes on a hotplate. For the last step of the device fabrication, Ca (30 nm)/Al (125 nm) cathodes were thermally evaporated through a shadow mask to define the cells. Current-voltage characteristics were measured using a Keithley 2400 SMU while the solar cells were illuminated by a Newport Solar Simulator at 100 mW·cm$^{-2}$ white light. The Solar Simulator was equipped with AM1.5G filters. The illumination intensity was calibrated using a Si photodiode. The complete device preparation and characterization is done in a dry-nitrogen atmosphere.

Power conversion efficiency is calculated using the following expression $$\eta = V_{oc} \times J_{sc} \times FF / P_{in}$$

where FF is defined as $$FF = V_{max} \times J_{max} / V_{oc} \times J_{sc}$$

OPV device characteristics for a blend of polymer: PC$_{61}$BM (coated from a o-dichlorobenzene solution at a total solid concentration of 30 mg·cm$^{-3}$) are shown in Table 1.

TABLE 1

Photovoltaic cell characteristics.

| Blend | Ratio | PCE (%) | FF (%) | $V_{oc}$ (mV) | $J_{sc}$ (mA/cm$^2$) |
|---|---|---|---|---|---|
| Polymer 1:PC$_{61}$BM | 1:1.5 | 3.62 | 60 | 810 | −7.48 |
| Polymer 2:PC$_{61}$BM | 1:1.5 | 0.39 | 30 | 392 | −3.26 |

The invention claimed is:

1. A conjugated polymer of formula IV

*—[(A)$_x$-(B)$_y$—(C)$_z$]$_n$—*           IV wherein
A, B, C denotes a distinct unit of formula IIIb,
x is >0 and ≤1,
y is ≥0 and <1,
z is ≥0 and <1,
x+y+z is 1, and
n is an integer >1

*—[Ar$^1$—Ar$^2$]$_g$—[Ar$^1$—U]$_h$—*           (IIIb)

wherein
Ar$^1$ and Ar$^2$ are different from U and are independently of each other selected from the group consisting of substituted aryl, unsubstituted aryl, substituted heteroaryl and unsubstituted heteroaryl,
g and h are integers and are at least 2, and
U is a divalent unit of formula (I)

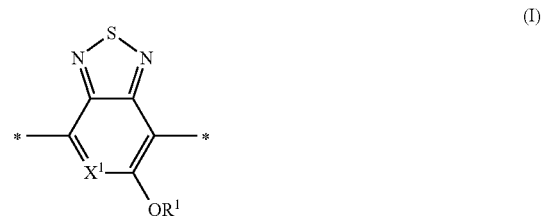
(I)

wherein
X$^1$ is C—F; and
R$^1$ is hydrogen or an alkyl having from 1 to 20 carbon atoms.

2. A polymer according to claim 1, wherein the polymer has a number average molecular weight of at least 1 kg mol$^{-1}$, determined by GPC.

3. A polymer according to claim 1, wherein the polymer is a block copolymer, a statistical copolymer, a statistical block copolymer or a random copolymer.

4. A mixture or blend comprising one or more polymers of claim 1, and one or more compounds or polymers having semiconducting, charge transport, hole/electron transport, hole/electron blocking, electrically conducting, photoconducting or light emitting properties.

5. A formulation comprising one or more polymers of claim 1, and one or more solvents.

6. A charge transport, semiconducting, electrically conducting, photoconducting or light emitting material in optical, electrooptical, electronic, electroluminescent or photoluminescent components or devices, comprising a polymer according to claim 1.

7. A component or device according to claim 6, which is selected from the group consisting of organic field effect transistors (OFET), thin film transistors (TFT), integrated circuits (IC), logic circuits, capacitors, radio frequency identification (RFID) tags, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

8. A component or device according to claim 7, wherein the component or device is an organic photovoltaic device (OPV).

9. A polymer according to claim 1, wherein n is 5 to 2000.

10. A polymer according to claim 1, wherein n is 50 to 500.

11. A process for preparing the polymer of claim 1, said process comprising a step of coupling monomers, therein comprised a monomer comprising the divalent unit of formula IIIb, said monomers comprising at least one functional monovalent group selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$, wherein X$^0$ is halogen, and Z$^0$, Z$^1$, Z$^2$, Z$^3$ and Z$^4$ are independently of each other selected from the group consisting of alkyl and aryl, each being optionally substituted, and two groups Z$^2$ may also together form a cyclic group.

* * * * *